(12) United States Patent
Williamson et al.

(10) Patent No.: US 12,550,741 B2
(45) Date of Patent: Feb. 10, 2026

(54) PROTRUDED SCRIBE FEATURE DELAMINATION MITIGATION

(71) Applicant: Texas Instruments Incorporated, Dallas, TX (US)

(72) Inventors: Jaimal Williamson, Dallas, TX (US); Guangxu Li, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 497 days.

(21) Appl. No.: 18/194,512

(22) Filed: Mar. 31, 2023

(65) Prior Publication Data

US 2024/0332213 A1 Oct. 3, 2024

(51) Int. Cl.
*H01L 23/00* (2006.01)
*H01L 23/31* (2006.01)
*H01L 23/498* (2006.01)
*H01L 23/528* (2006.01)

(52) U.S. Cl.
CPC ........ *H01L 23/562* (2013.01); *H01L 23/3121* (2013.01); *H01L 23/49822* (2013.01); *H01L 23/528* (2013.01); *H01L 24/11* (2013.01); *H01L 24/16* (2013.01); *H01L 2224/11462* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 5,789,302 A * | 8/1998 | Mitwalsky | H01L 21/78 438/460 |
| 2005/0179213 A1* | 8/2005 | Huang | H01L 23/564 277/620 |
| 2015/0021762 A1 | 1/2015 | Williamson et al. | |
| 2017/0221837 A1* | 8/2017 | Hedrick | H01L 23/49811 |
| 2022/0254736 A1 | 8/2022 | Williamson et al. | |

* cited by examiner

*Primary Examiner* — Hung K Vu
(74) *Attorney, Agent, or Firm* — Ronald O. Neerings; Frank D. Cimino

(57) ABSTRACT

An electronic device includes a semiconductor die having a semiconductor body, a metallization structure over the semiconductor body, a protective overcoat layer over the metallization structure, a polyimide layer over the protective overcoat layer, a crack arrest structure including contiguous metal crack arrest features in the metallization structure that extend from the protective overcoat layer toward the semiconductor body, conductive terminals that extend from the metallization structure through the protective overcoat layer and the polyimide layer, and a protruded metal feature over the crack arrest structure and at least partially abutting the polyimide layer, and a package structure that at least partially encloses the semiconductor die.

20 Claims, 30 Drawing Sheets

_US 12,550,741 B2_

PROTRUDED SCRIBE FEATURE DELAMINATION MITIGATION

BACKGROUND

Delamination or separation of structures in a packaged electronic device can lead to device failures through crack propagation. Humidity and thermal cycling in manufacturing or in use in a host system can cause the onset of cracks, particularly at the interface between materials with differing properties such as coefficient of thermal expansion (CTE). For example, organic epoxy-based underfill materials or epoxy mold compound (EMC) do not adhere as well to inorganic-based passivation material, such as a silicon nitride (SiN) protective overcoat (PO) layer in a scribe street of a silicon die, as they do to an organic-based polyimide passivation layer. Electronic device packages often have a specific region of the silicon scribe street where the organic-based underfill or EMC is adhered to inorganic-based SiN passivation material and delamination can occur at the scribe region of the die during moisture sensitivity level preconditioning or temperature cycling. This can result in the onset of delamination leading to a crack propagation path that can extend from the epoxy mold compound to the inorganic protective overcoat interface of the EMC, to the polyimide interface, and then into the metallization and back end processed structures of the semiconductor die and potentially cause electrical failures. Materials used in the device packaging can be changed to promote adhesion, for example, molded underfill or EMC materials in order to improve adhesion to inorganic passivation materials or to better balance the substrate CTE to match the silicon to lower shear stresses but such approaches require recertification and may not result in improved temperature cycling reliability.

SUMMARY

In one aspect, an electronic device includes a semiconductor die and a package structure, where the semiconductor die has a semiconductor body, a metallization structure over the semiconductor body, a protective overcoat layer over the metallization structure, a polyimide layer over the protective overcoat layer, a crack arrest structure including contiguous metal crack arrest features in the metallization structure that extend from the protective overcoat layer toward the semiconductor body, conductive terminals that extend from the metallization structure through the protective overcoat layer and the polyimide layer, and a protruded metal feature over the crack arrest structure and at least partially abutting the polyimide layer, and the package structure at least partially encloses the semiconductor die.

In another aspect, a system includes a circuit board and an electronic device with a semiconductor die and a package structure. The semiconductor die has a semiconductor body, a metallization structure over the semiconductor body, a protective overcoat layer over the metallization structure, a polyimide layer over the protective overcoat layer, a crack arrest structure including contiguous metal crack arrest features in the metallization structure that extend from the protective overcoat layer toward the semiconductor body, conductive terminals that extend from the metallization structure through the protective overcoat layer and the polyimide layer and are electrically coupled to conductive features of the circuit board, and a protruded metal feature over the crack arrest structure and at least partially abutting the polyimide layer, and the package structure at least partially encloses the semiconductor die.

In a further aspect, a method of fabricating an electronic device includes forming a protective overcoat layer over a crack arrest structure with contiguous metal crack arrest features in a metallization structure over a semiconductor body of a wafer, forming a protruded metal feature over the crack arrest structure, forming conductive terminals that extend from the metallization structure through the protective overcoat layer, and forming a polyimide layer over the protective overcoat layer and at least partially abutting the protruded metal feature.

DETAILED DESCRIPTION

Figure 1:
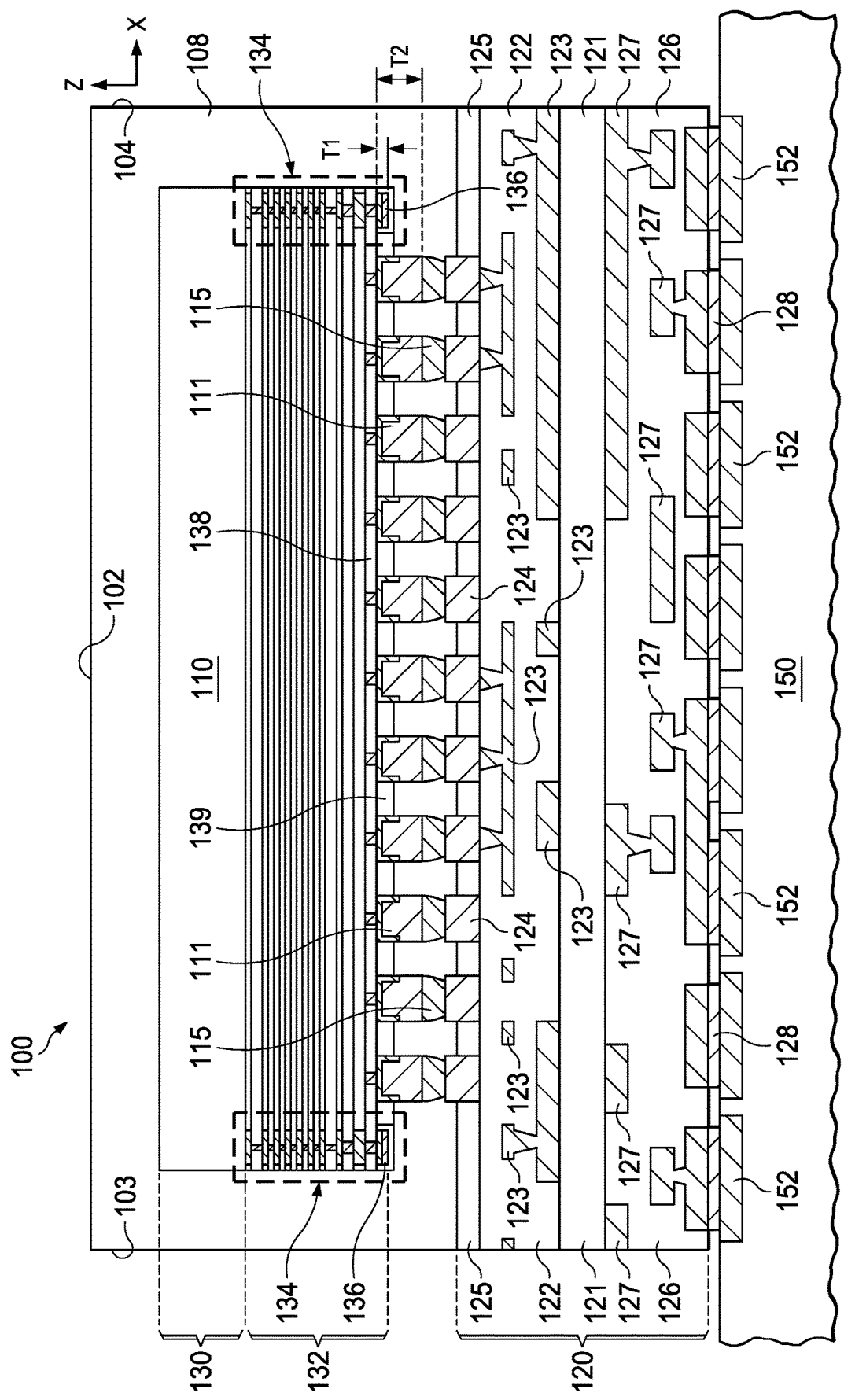
FIG. 1 is a sectional side elevation system view of a packaged electronic device having a protruded metal feature over a crack arrest structure to mitigate delamination and crack propagation.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value.

Figure 1A:
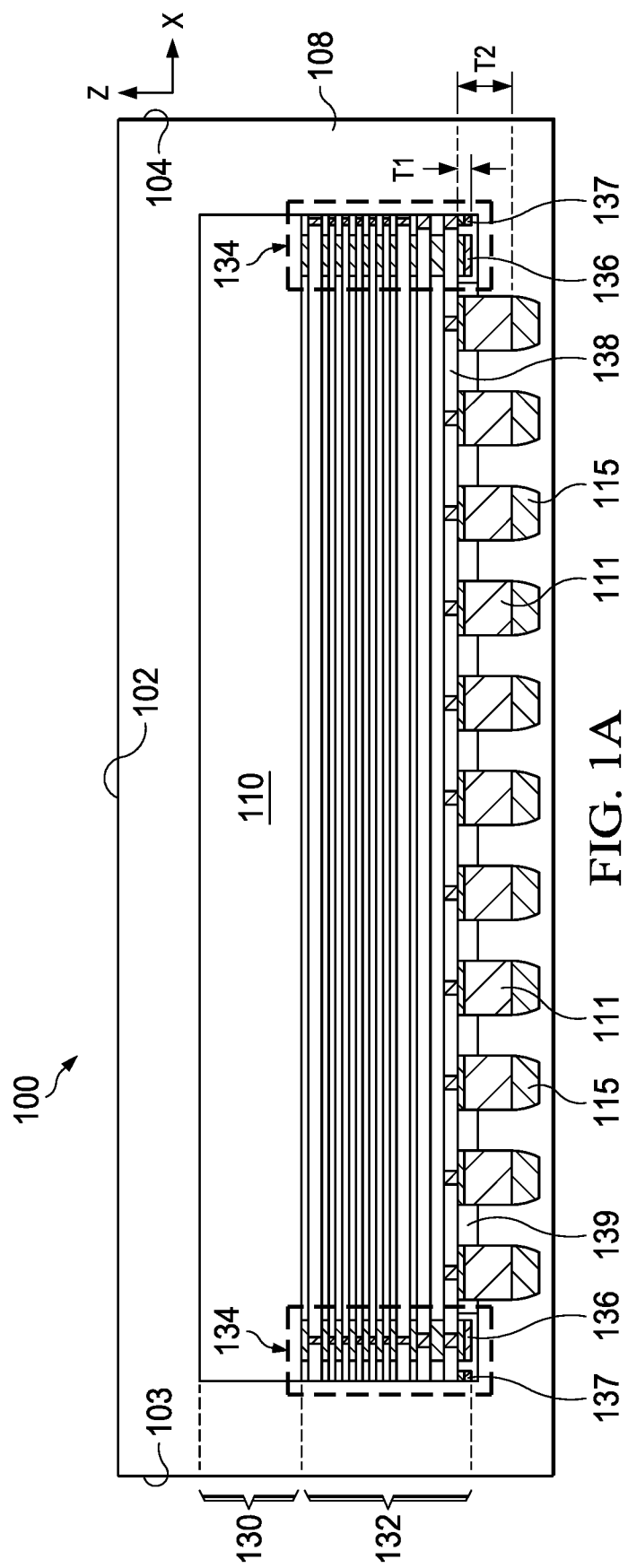
FIG. 1A is a sectional side elevation view of another implementation having a second protruded metal features to mitigate delamination and crack propagation.

FIGS. 1 and 1A show alternate implementations of a packaged electronic device 100 with a protruded metal feature 136 over a crack arrest structure 134 to mitigate delamination and crack propagation, where the example of FIG. 1A includes a second protruded metal feature 137 spaced laterally outward from the first protruded metal feature 136. FIGS. 1 and 1A show the electronic device 100 examples installed in a system, such as a smart phone, laptop or desktop computer, a tablet, an automotive system, an industrial system, etc. FIGS. 1 and 1A show the electronic device 100 examples in an example position or orientation in a three-dimensional space with a first direction X, a perpendicular (orthogonal) second direction Y (into the page, not numerically designated in FIGS. 1 and 1A), and a third direction Z that is perpendicular (orthogonal) to the respective first and second directions X and Y. Structures or features along any two of these directions are orthogonal to one another. The electronic device 100 has a first (e.g., bottom) side and an opposite second (e.g., top) side 102, which are spaced apart from one another along the third direction Z. The electronic device 100 has laterally opposite third and fourth sides 103 and 104 (FIGS. 1 and 1A) that are spaced apart from one another along the first direction X, and opposite fifth and sixth sides (not shown) that are spaced apart from one another along the second direction. The sides in one example have substantially planar outer surfaces. In other examples (not shown), one or more of the sides of the electronic device 100 have curves, angled features, or other non-planar surface features. The electronic device 100 has a package structure 108, such as a molded plastic structure that forms all or a portion of the second side and upper portions of the lateral sides. The illustrated electronic device 100 is a flip-chip chip scale package (FCCSP) device. Other device package forms and types can be used in other implementations, such as having leads formed from a starting lead frame and internal bond wire connections, flip chip ball grid array (FCBGA, e.g., FIG. 27 below) devices, etc.

The electronic device 100 also includes a semiconductor die 110 partially enclosed by the package structure 108 and flip-chip attached (e.g., by solder connections) to a multilevel package substrate 120, where the molded package structure 108 extends onto and encloses portion of a top side of the multilevel package substrate 120. The semiconductor die 110 has generally planar top and bottom sides and conductive terminals 111 along the bottom side. The semiconductor die 110 includes one or more electrical circuit components (not shown) as well as conductive terminals 111. At least some of the conductive terminals 111 provide circuit connections to interconnect other external devices and/or components to a circuit of the electronic device 100. The conductive terminals 111 in the illustrated examples are conductive metal pillars (e.g., copper, etc.) that extend outward from the bottom side of the semiconductor die 110. This facilitates flip-chip die attachment and soldering to form electrical connections to the circuitry of the electronic device 100. The conductive terminals 111 in one example each have a solder cap 115 applied to the ends thereof, for example, by electroplating during a bumping process or other suitable dipping, printing or other process to allow flip-chip attachment and thermal reflow to make electrical and mechanical connections thereto. In one example for flip chip chip scale packages, the terminals 111 and copper pillars formed by electroplating in a bumping process, which followed by electroplating of the solder portions 115 on top of the copper pillar during the wafer bumping process. For FCBGAs, the flip chip side substrate pad can have solder as well as a multitude of other finishes like OSP, ENEPIG, etc. The bump interconnect formed on the wafer in one example is or includes copper and a solder cap, which is subsequently attached to the package substrate 120.

The package substrate 120 in the illustrated examples is a multilevel package substrate 120. In other implementations, a single level substrate can be used and/or a different type of substrate can be used. The multilevel package substrate 120 includes multiple dielectric layers or levels with patterned conductive features formed thereon and therebetween to provide circuit signal and power routing for the circuitry of the electronic device 100. The illustrated multilevel package substrate 120 has a core (e.g., middle) dielectric layer 121 that may include conductive vias or other conductive structures extending therethrough (not shown), and an upper dielectric level 122 with patterned conductive metal features 123 (e.g., copper or other metal) and upper conductive features 124 facing the semiconductor die 110. Other substrate forms and types can be used in different implementations, including coreless substrates (not shown). The upper dielectric level 122 can have a single dielectric layer, such as compression molded dielectric material, or can include multiple dielectric layers with associated conductive metal interconnection features 123 such as traces, vias, etc. The conductive terminals 111 of the semiconductor die 110 are soldered to respective ones of the conductive features 124 of the package substrate 120 by the respective solder portions 115. The multilevel package substrate 120 in one example also includes a solder mask layer 125 on a top side of the upper dielectric layer 121 with openings to allow electrical and mechanical connection of the respective conductive features 124 to the conductive terminals 111 and associated solder portions 115 of the bottom side of the semiconductor die 110, for example, by flip-chip die attach processing such as placement and subsequent thermal reflow to create solder connections as shown in FIG. 1.

The illustrated multilevel package substrate 120 also has a lower dielectric level 126 with patterned conductive metal features 127 (e.g., copper or other metal). Certain of the conductive metal features 127 have sides exposed to the bottom side of the electronic device 100 to allow electrical connections to a host circuit board, for example, by solder 128 in the illustrated FCCSP configuration of the electronic device 100. The lower dielectric level 126 can have a single dielectric layer, such as compression molded or laminated dielectric material, or can include multiple dielectric layers with associated conductive metal interconnection features 127 such as traces, vias, etc. as shown in the example of FIG. 1.

The semiconductor die 110 has a semiconductor body 130 (e.g., silicon or other suitable semiconductor material) and a metallization structure 132 over the semiconductor body 130, with a crack arrest structure 134 formed in the metallization structure 132. The crack arrest structure 134 includes contiguous metal crack arrest features in the metallization structure 132 that extend from a protective overcoat layer 138 toward the semiconductor body 130 proximate the lateral sides of the semiconductor die 110. The protective overcoat layer 138 extends over the metallization structure 132. In one example, the crack arrest 134 extends around four peripheral sides of the semiconductor die 110 to mitigate cracking of the semiconductor die 110 and help protect transistors and other components formed on or in the semiconductor body 130. In one example, the protective overcoat layer 138 is or includes an inorganic-based passivation material, such as a silicon nitride (SiN), silicon oxynitride ($SiO_xN_y$), or silicon dioxide ($SiO_2$). An organic-based passivation layer, such as a polyimide 139 extends over the protective overcoat layer 138, and the conductive terminals 111 extend from the metallization structure 132 through the protective overcoat layer 138 and the polyimide layer 139.

The flip-chip chip scale package example electronic device 100 is installed on a circuit board 150 in the system of FIG. 1, with respective ones of the substrate leads soldered to provide mechanical and electrical connections to conductive metal board pads 152 of the circuit board 150.

The protruded metal feature 136 extends over the crack arrest structure 134 and at least partially abuts the polyimide layer 139 as shown in the example of FIG. 1. The protruded metal feature 136 has a first thickness T1 along the third direction Z. In one example, the protruded metal feature 136 is or includes copper or solder and the first thickness T1 is approximately 3-10 µm, such as approximately 5 µm. In these or another example, the first thickness T1 is approximately equal to the thickness of the polyimide layer 139 along the third direction Z. The protruded metal feature 136 may be covered by the polyimide layer 139 as shown in the examples of FIGS. 1 and 1A (e.g., and FIGS. 18, 22 and 23 below). In other examples (e.g., FIGS. 19 and 20 below), the package structure 108 at least partially abuts the protruded metal feature 136.

In further examples, the protruded metal feature 136 can have one or more non-planar sides that faces laterally inward and/or faces a lateral side of the semiconductor die 110 (e.g., FIGS. 18, 20 and 23 below). In some examples, the laterally outward side of the protruded metal feature 136 (e.g., or of any included second protruded metal feature 137) can extend to the laterally outward side of the semiconductor die 110, for example, depending on the location of a die singulation or separation cut in the scribe region of a starting wafer.

The conductive terminals 111 have a second thickness T2 along the third direction Z, where the second thickness T2 in one example is greater than the first thickness T1 of the protruded metal feature 136. In one example, the second thickness T2 of the conductive terminals 111 is approximately 20 µm to 50 µm, such as approximately 25 µm to approximately 40 µm. In the above or other examples, a first (e.g., top) side of the protruded metal feature 136 abuts the crack arrest structure 134, and the polyimide layer 139 encloses the remaining sides of the protruded metal feature 136. In these or other examples, the protruded metal feature 136 is spaced apart from a lateral side of the semiconductor die 110, for example, as shown in FIGS. 1 and 1A. The presence of the protruded metal feature 136 in FIGS. 1 and 1A decreases the shear strength of the semiconductor die 110 and reduces the likelihood of crack propagation thus limiting or avoiding inorganic to organic interface cracking. The electronic device 100 in FIG. 1A has a second protruded metal feature 137 spaced laterally outward from the first protruded metal feature 136 to prevent or mitigate crack propagation.

Referring to FIGS. 2-17, FIG. 2 shows a method 200 of fabricating an electronic device and FIGS. 3-17 show the electronic device 100 of FIG. 1 undergoing fabrication processing according to an example implementation of the method 200. The example method 200 includes wafer processing with transistor and other component fabrication on or in a semiconductor body using a starting semiconductor wafer at 202.

Figure 3:
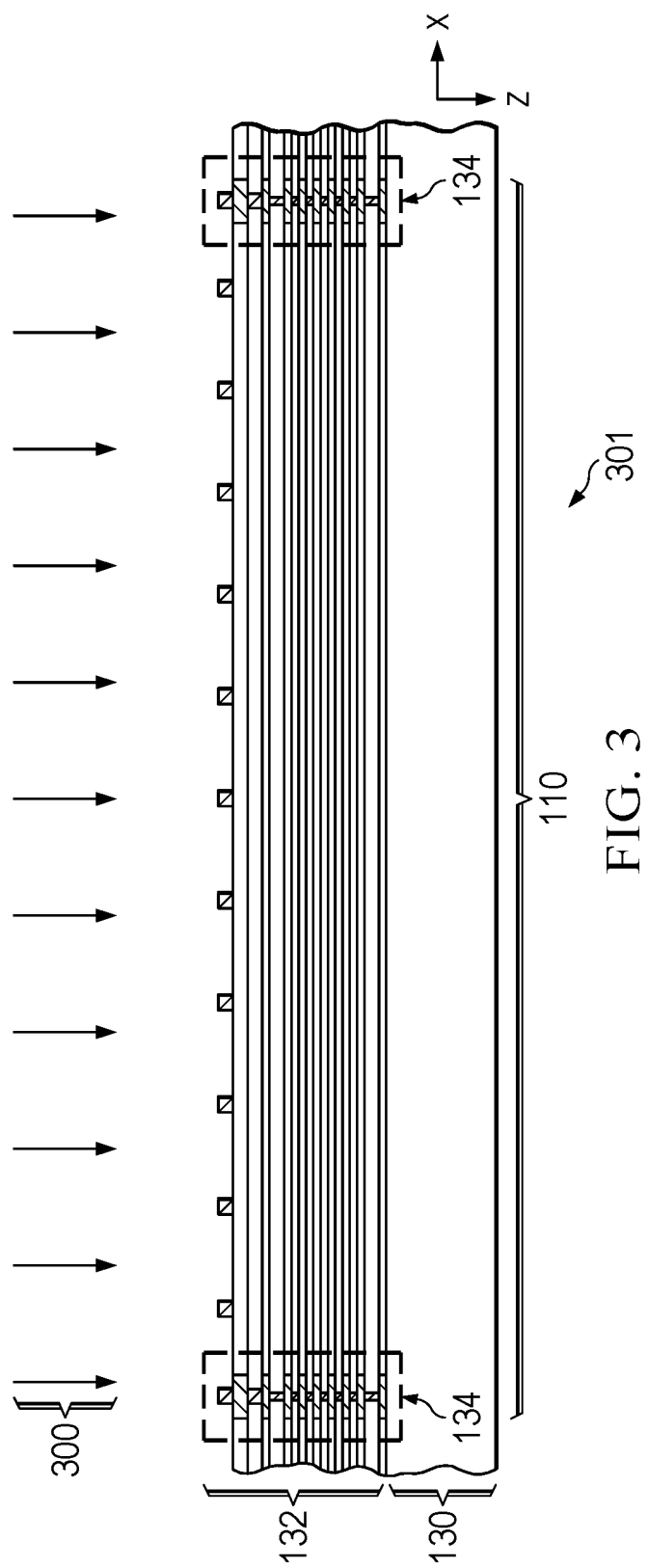
FIGS. 3-17 are partial sectional side elevation views of the electronic device of FIG. 1 undergoing fabrication processing according to an example implementation of the method of FIG. 2.

At 204, the method 200 includes forming a single or multilevel metallization structure over the semiconductor body. FIG. 3 shows one example, in which a metallization fabrication process 300 is performed on a starting wafer 301 having rows and columns of unit areas corresponding to prospective semiconductor dies 110. FIG. 3 shows a section view through one such unit area designated with a bracket as 110. The process 300 forms the multilevel metallization structure 132 above the semiconductor body 130, for example, directly on or over the semiconductor body 130. The process 300 includes forming the contiguous metal crack arrest features that extend along the third direction Z from the top side of the metallization structure 132 to the semiconductor body 130 proximate the lateral sides of the illustrated unit area corresponding to the prospective semiconductor die 110. The metallization process 300 also includes forming other electrical interconnection structures (not shown in the drawings) to interconnect transistors and/or other components of one or more circuits of the prospective semiconductor die 110, for example, using single and/or dual damascene processing steps (not shown) to form one or more levels having dielectric material(s) and conductive structures such as traces, inter level vias, etc.

Figure 4:
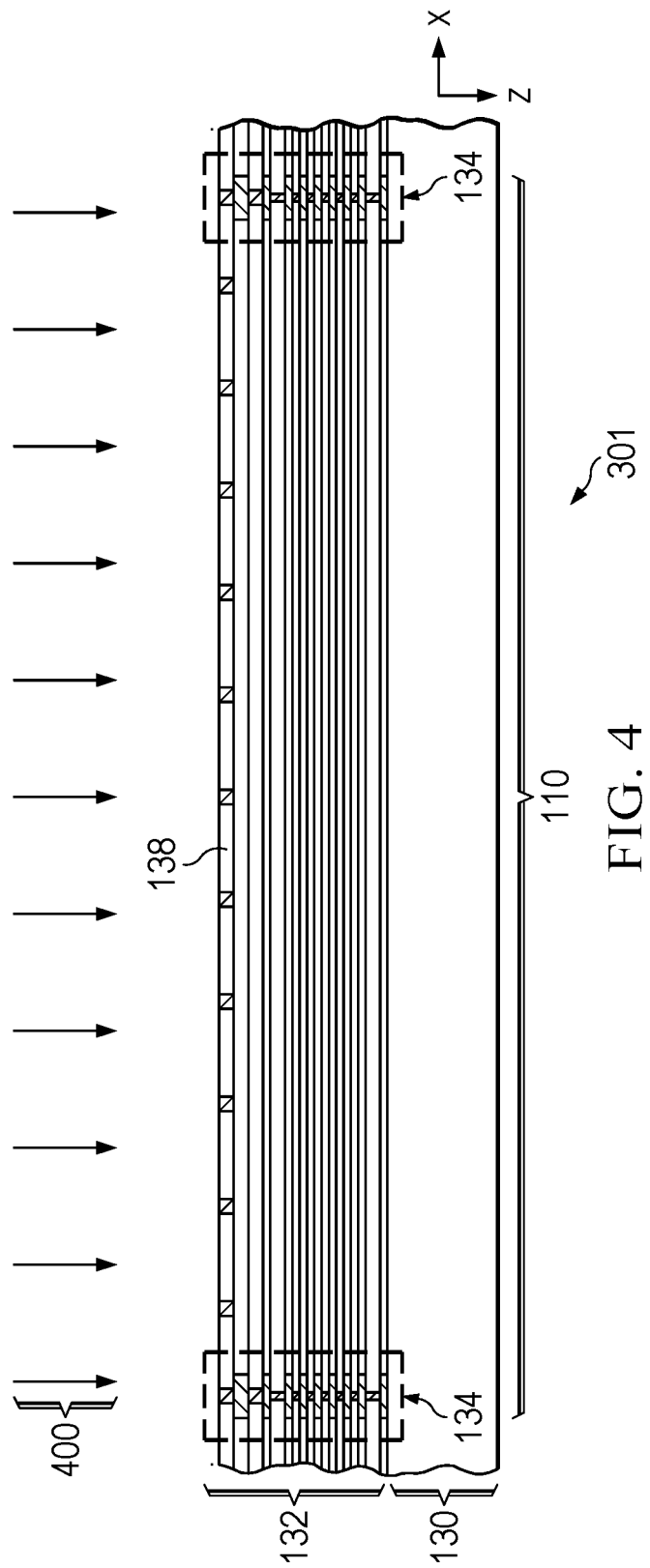

The method 200 continues at 206 with protective overcoat layer formation. FIG. 4 shows one example, in which a deposition process 400 is performed that forms the protective overcoat layer 138 over (e.g., directly on or otherwise above) the metallization structure 132 including over (e.g., directly on or otherwise above) the crack arrest structure 134. In one example, the process 400 forms the protective overcoat layer 138 at 206 to any suitable thickness that is or includes an inorganic-based passivation material, such as a silicon nitride, silicon oxynitride, silicon dioxide, etc.

Figure 2:
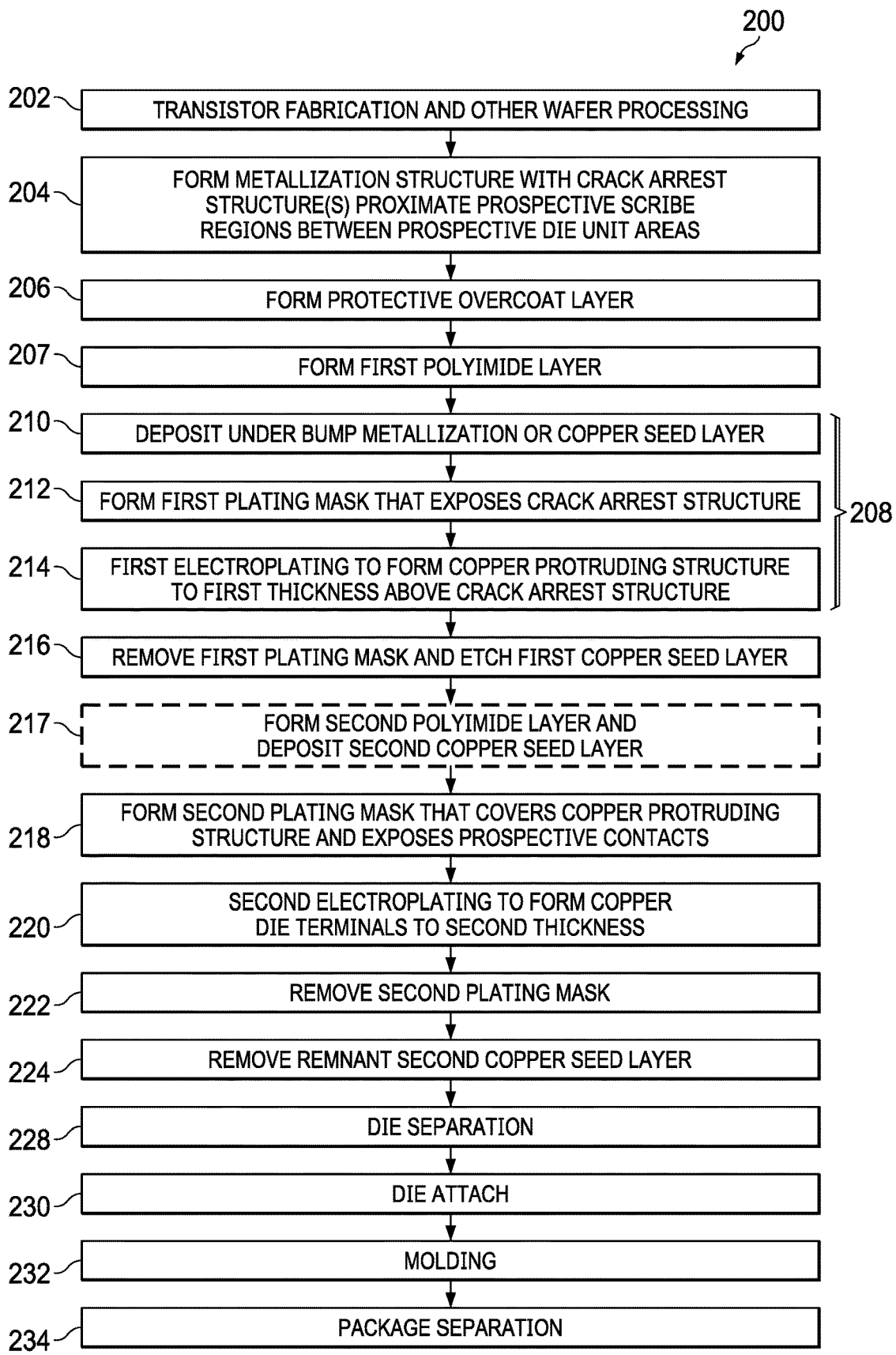
FIG. 2 is a flow diagram showing a method of fabricating an electronic device.
Figure 5:
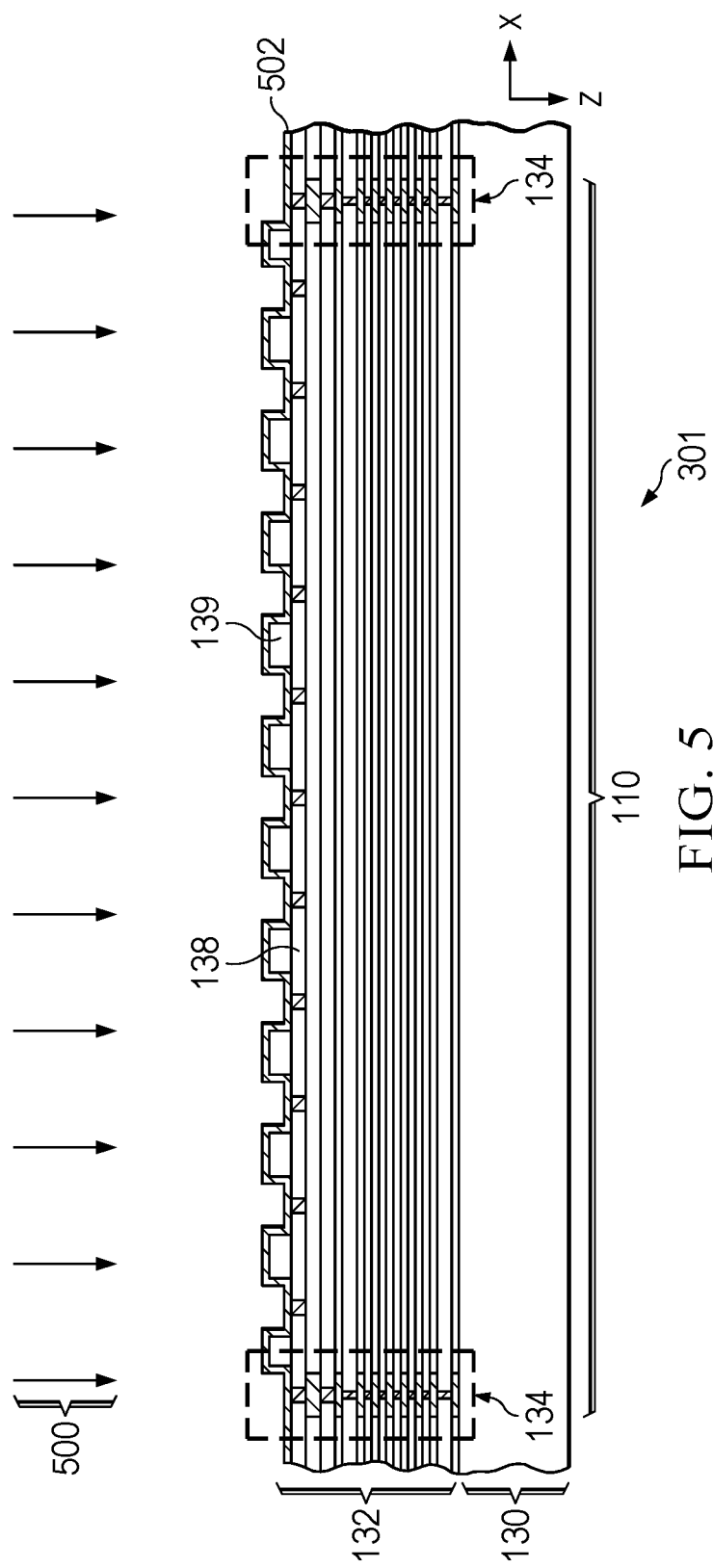

The method 200 continues at 207 in FIG. 2 with forming an organic passivation layer 139 with openings corresponding to prospective die terminals 111 (e.g., copper pillars, solder bumps, etc.) and prospective protruded metal features 136. FIG. 5 shows one example, in which a deposition process 500 is performed that forms the polyimide layer 139 on select portions of the protective overcoat layer 138 in between the prospective conductive terminal areas and the prospective protruded metal feature locations. In the illustrated example, the polyimide layer 139 is deposited at 207 to a thickness that is approximately the same as the first thickness T1 of the prospective protruded metal feature 136. In certain examples, the thickness of the polyimide layer 139 can be greater than the first thickness T1 of the protruded metal feature 136, and the polyimide layer 139 can be supplemented later in the process (e.g., at 217 in FIG. 2) to extend over the top side of the protruded metal feature 136. In another implementation, the deposition process 500 forms the polyimide layer 139 such that peripheral portions of the subsequently formed protruded metal feature 136 are not completely covered by the polyimide layer 139 and are subsequently abutted by epoxy molding compound (EMC) or underfill material in subsequent molding processing at 232 in FIG. 2.

At 208 in FIG. 2, the method 200 further includes forming a protruded metal feature at least partially over the crack arrest structure. The protruded metal feature can be formed at any suitable point in the fabrication process 200, for example, at the wafer level, at bumping, at the packaging stage after die separation, etc. The protruded metal feature (e.g., 136 in FIGS. 1 and 1A above) can be any suitable metal structure, such as copper, aluminum, solder, etc. In one example, a solder protruded metal feature 136 can be formed in particular implementations at least partially above the crack arrest structure 134, for example, by printing or other selective deposition process (not shown), such as after die singulation and before flip chip die attach processing or die attachment to a lead frame panel prior to bond wire formation (not shown).

Figure 6:
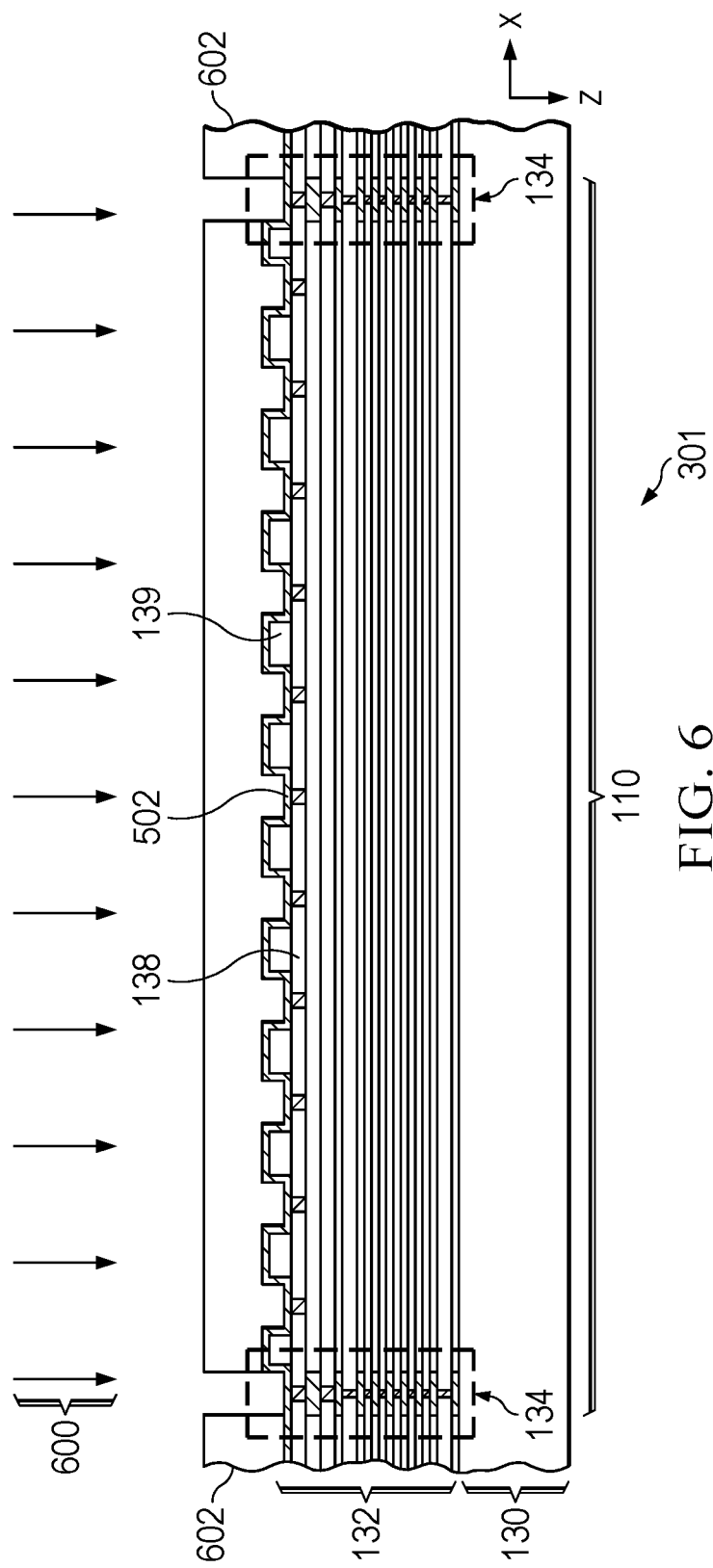
Figure 7:
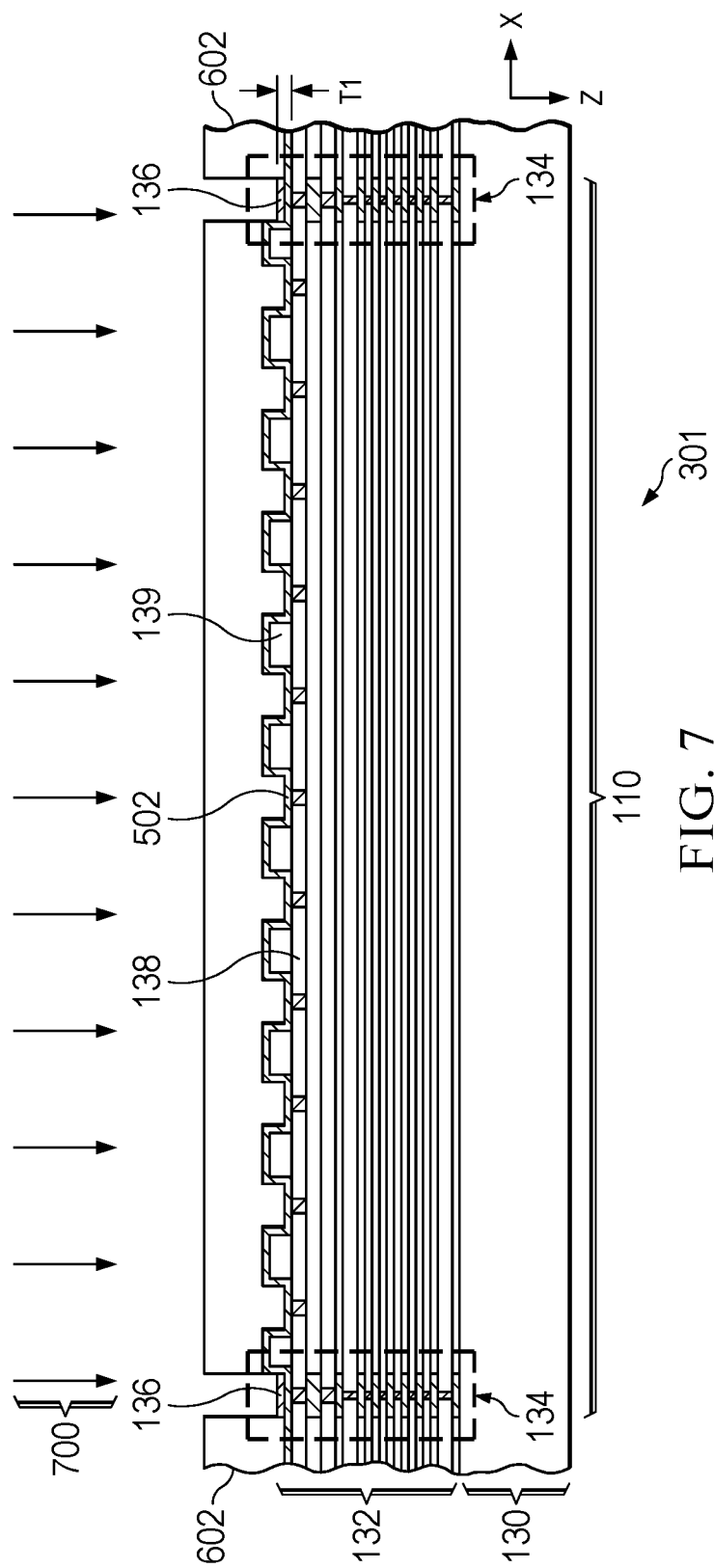

FIGS. 5-7 show another example, in which a copper protruded metal feature 136 is formed at 210-214 in FIG. 2 by electroplating using a first plating mask as part of a bumping process that also forms the conductive terminals 111, for example, at the wafer level before die singulation. At 210 in FIG. 2, a copper seed layer is deposited over a top side of the protective overcoat layer 138. In this example, a deposition process is performed in FIG. 5, such as a chemical vapor deposition (CVD) process, which forms a copper seed layer 502 over the protective overcoat layer 138 and over certain conductive metal features of a top level of the metallization structure 132, including a top metal feature of the crack arrest structure 134. The copper seed layer 502 is formed to any suitable thickness, for example, that facilitates subsequent selective electroplating of further copper material thereon. In another example, the layer 502 can be a stack of two or more conductive metal layers, sometimes referred to as under bump metallurgy (UBM) in a bumping process.

At 212 in FIG. 2, the example implementation further includes forming a first plating mask that exposes portions of the copper seed layer at least partially over the crack arrest structure 134, and any other locations in which a protruded metal feature is desired (e.g., laterally outward for forming the second protruded metal feature 137 shown above in FIG. 1A). FIG. 6 shows one example, in which a first plating mask 602 is formed (e.g., deposited, selectively exposed, and patterned) that exposes an area over the crack arrest structure 134 (e.g., corresponding to the subsequently formed protruded metal feature 136 in the example of FIG. 1 above). In the illustrated example, the copper seed layer 502 is used as a base for electroplating both the prospective protruded metal feature 136 and the conductive terminals 111 in each unit area corresponding to a prospective semiconductor die 110. In one implementation, the first plating mask 602 includes openings for the prospective protruded metal feature 136 (e.g., and any included second protruded metal feature 137) in each unit area of the processed wafer 301, and the first plating mask 602 covers the areas corresponding to prospective conductive terminals 111 as shown in FIG. 6. In another implementation (not shown), the first plating mask can include openings that expose the areas corresponding to the prospective conductive terminals 111 in each unit area of a processed wafer 301.

At 214 in FIG. 2, the method 200 continues with electroplating to form the protruded metal feature 136 (e.g., and any included second protruded metal feature 137, not shown). FIG. 7 shows one example, in which an electroplating process 700 is performed that deposits copper to form the protruded metal feature 136 in the openings of the first plating mask 602 to the first thickness T1 (e.g., approximately 3-10 µm, such as approximately 5 µm).

Figure 8:
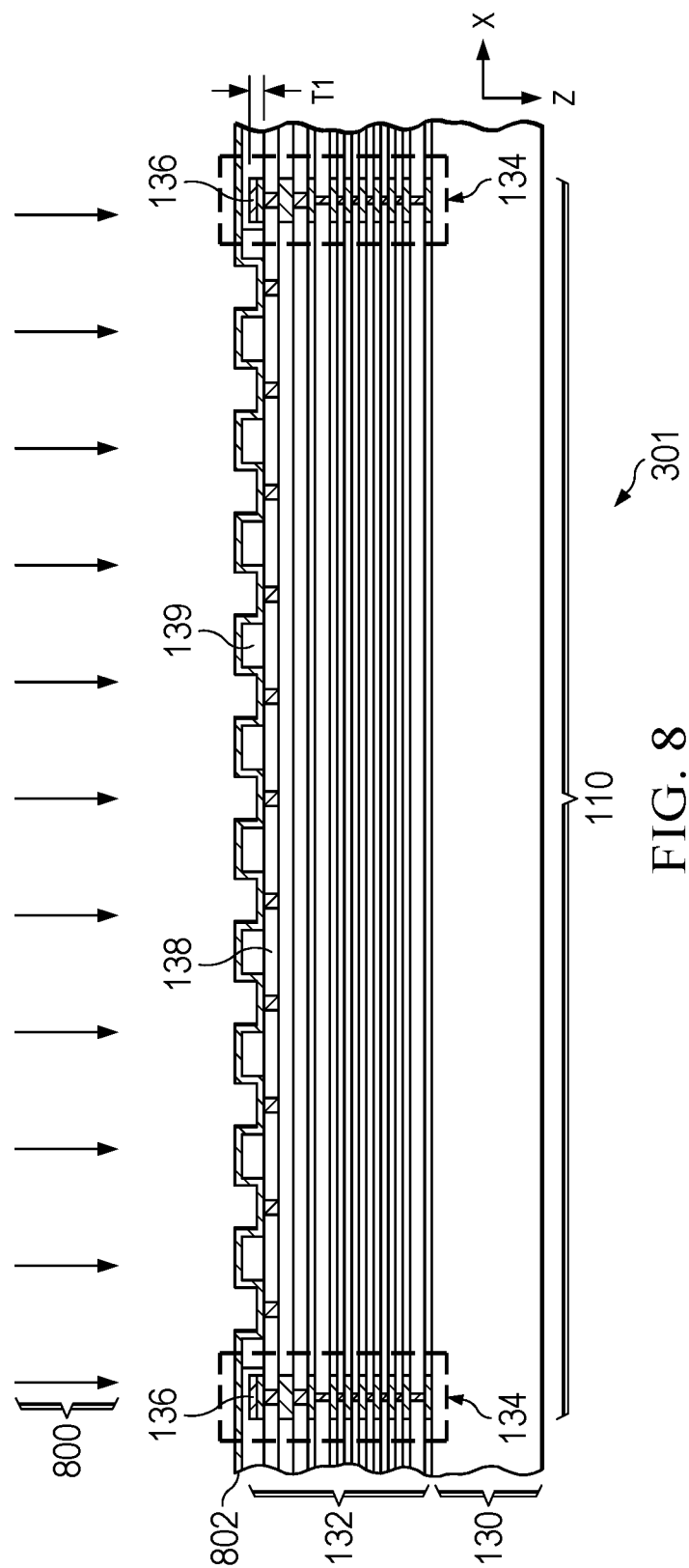

At 216 in FIG. 2, the first plating mask 602 is removed and the remaining copper seed layer is removed by an etching or other process that removes the exposed portions of the copper seed layer 502. FIG. 8 shows one example, in which a process 800 is performed that removes the first plating mask 602, leaving the protruded metal feature 136 in each unit area the processed wafer 301, and exposing the remainder of the copper seed layer 502 and an etch process (not shown) is performed that removes the exposed portions of the copper seed layer 502.

At 217 in FIG. 2, one implementation of the method 200 includes an optional second polyimide layer formation and deposition of a second copper seed layer. The example of FIG. 8 shows one implementation, in which a further polyimide deposition is performed (e.g., spin coating or other suitable process, not shown) that supplements the previously deposited polyimide layer 139 to cover the top side of the protruded metal feature 136, where the total polyimide thickness in such examples can exceed the first thickness T1 of the protruded metal feature 136. FIG. 8 further shows a subsequently formed second copper seed layer 802 formed by another suitable deposition process (e.g., CVD, etc., not shown).

Figure 9:
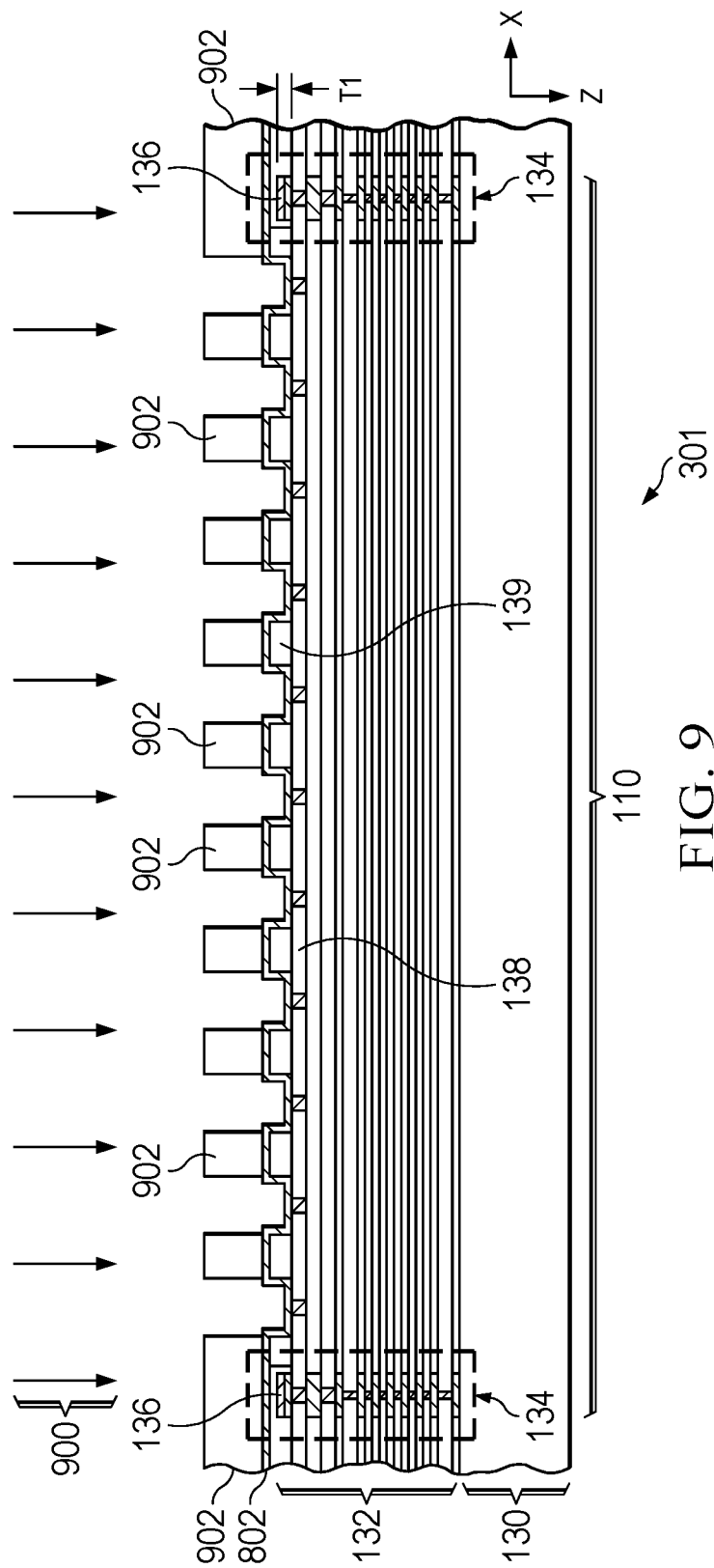

At 218 in FIG. 2, a second plating mask is formed that covers the copper protruded metal feature 136 in each unit area and exposes areas of the second copper seed layer 802 that correspond to the prospective conductive terminals 111. FIG. 9 shows one example, in which a process 900 is performed that forms a second plating mask 902. In the illustrated example, the prospective conductive terminals 111 have not been plated because these areas were covered by the first plating mask 602 during the first plating process 700 (FIG. 7 above). In another implementation, the areas of the copper seed layer 502 that correspond to the prospective conductive terminals 111 can be exposed by the first plating mask 602, and partially plated to the first thickness T1 during the first plating process 700, and the partially plated conductive terminals 111 can be exposed by the second plating mask 902, which can speed up the bumping process by shortening the second plating operation at 218 to finish plating the conductive terminals 111.

Figure 10:
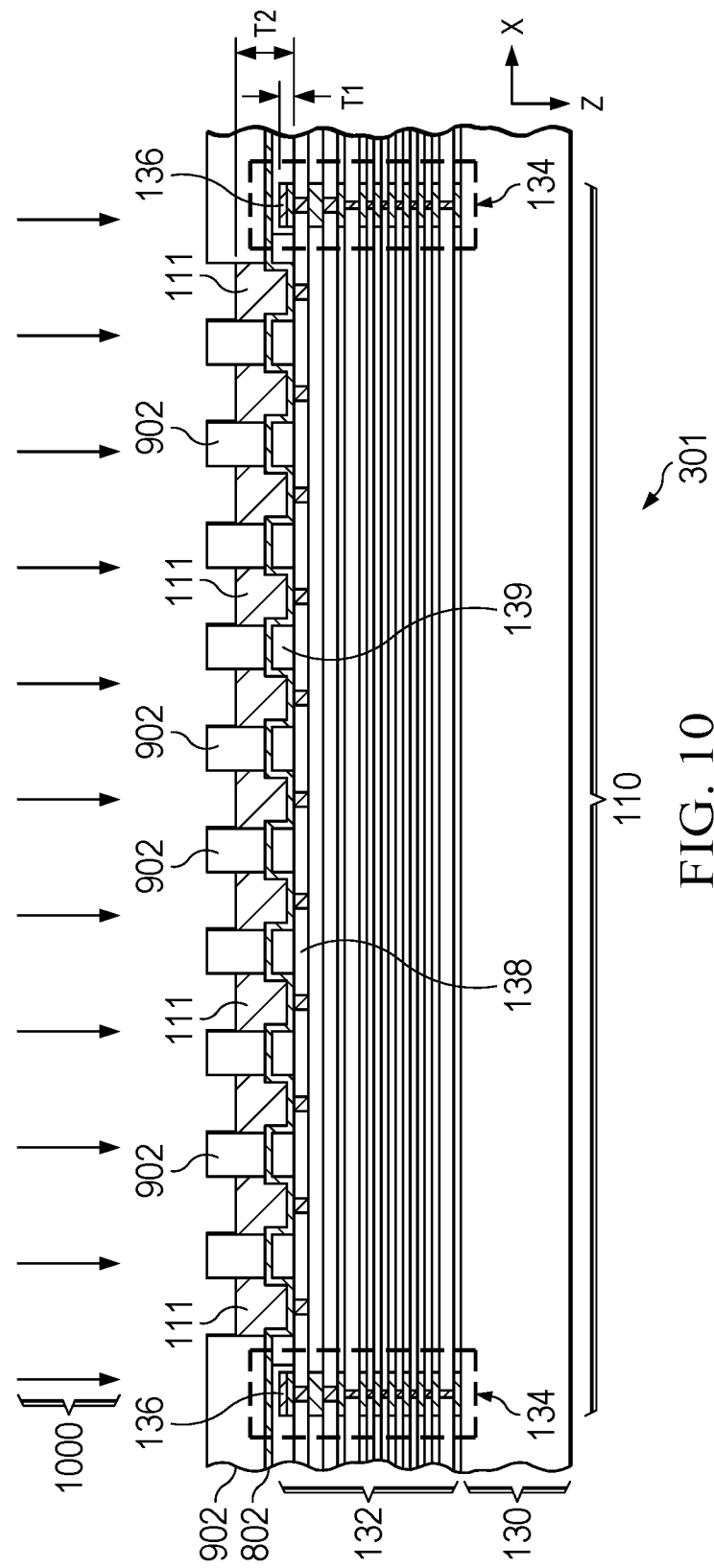

The illustrated example continues at 220 in FIG. 2 with a second plating process to form the conductive terminals 111 in each unit area corresponding to a prospective semiconductor die 110 of the processed wafer 301. FIG. 10 shows one example, in which a second electroplating process 1000 is performed that deposits copper in the openings of the second plating mask 902 in order to form the conductive terminals 111 to the second thickness T2 (e.g., approximately 20 µm to 50 µm, such as approximately 25 µm to approximately 40 µm).

Figure 11:
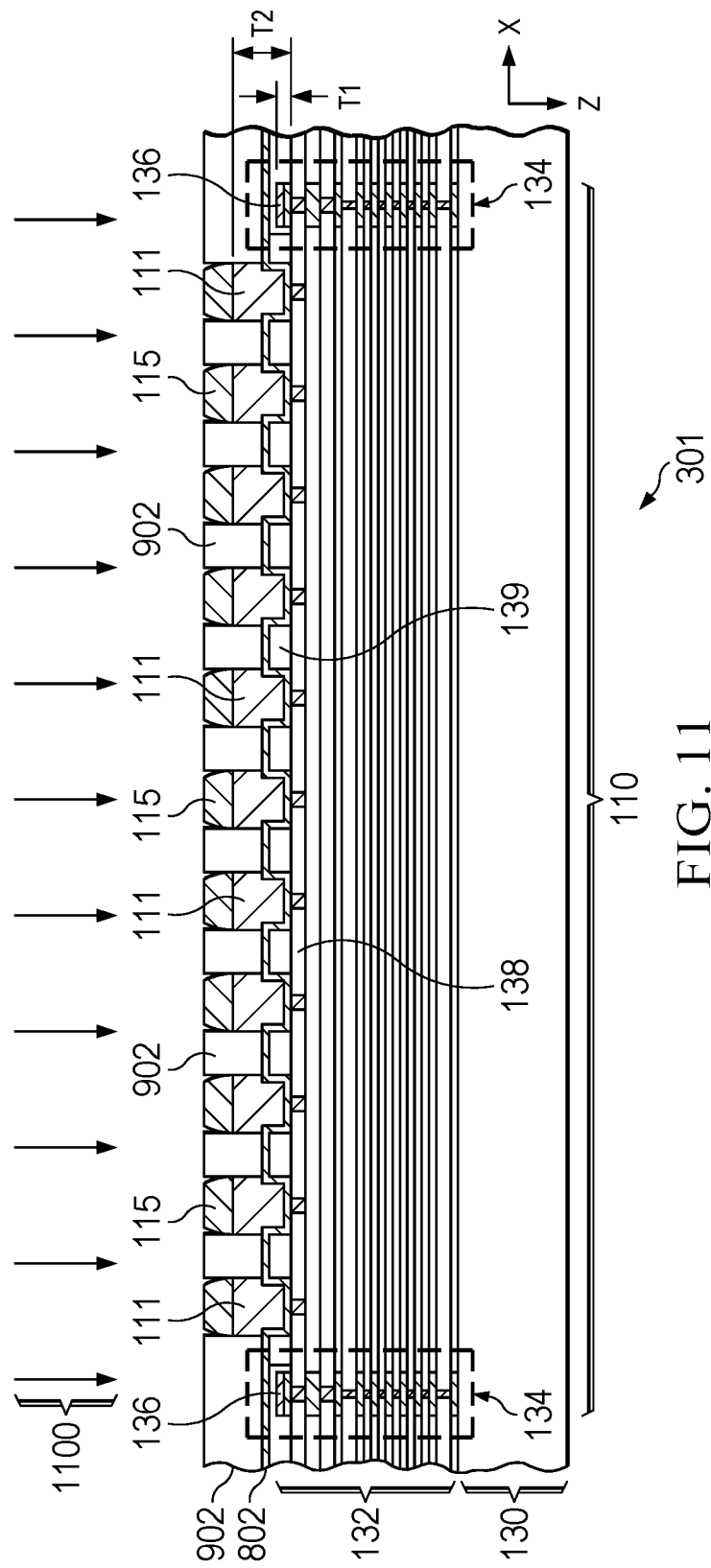

The method 200 continues in one example with further electroplating to form the solder portions 115 on the ends of the conductive terminals 111. FIG. 11 shows one example, in which an electroplating process 1100 is performed that forms the solder portions 115 on the exposed ends of the copper pillar terminals 111 using the second plating mask 902.

Figure 12:
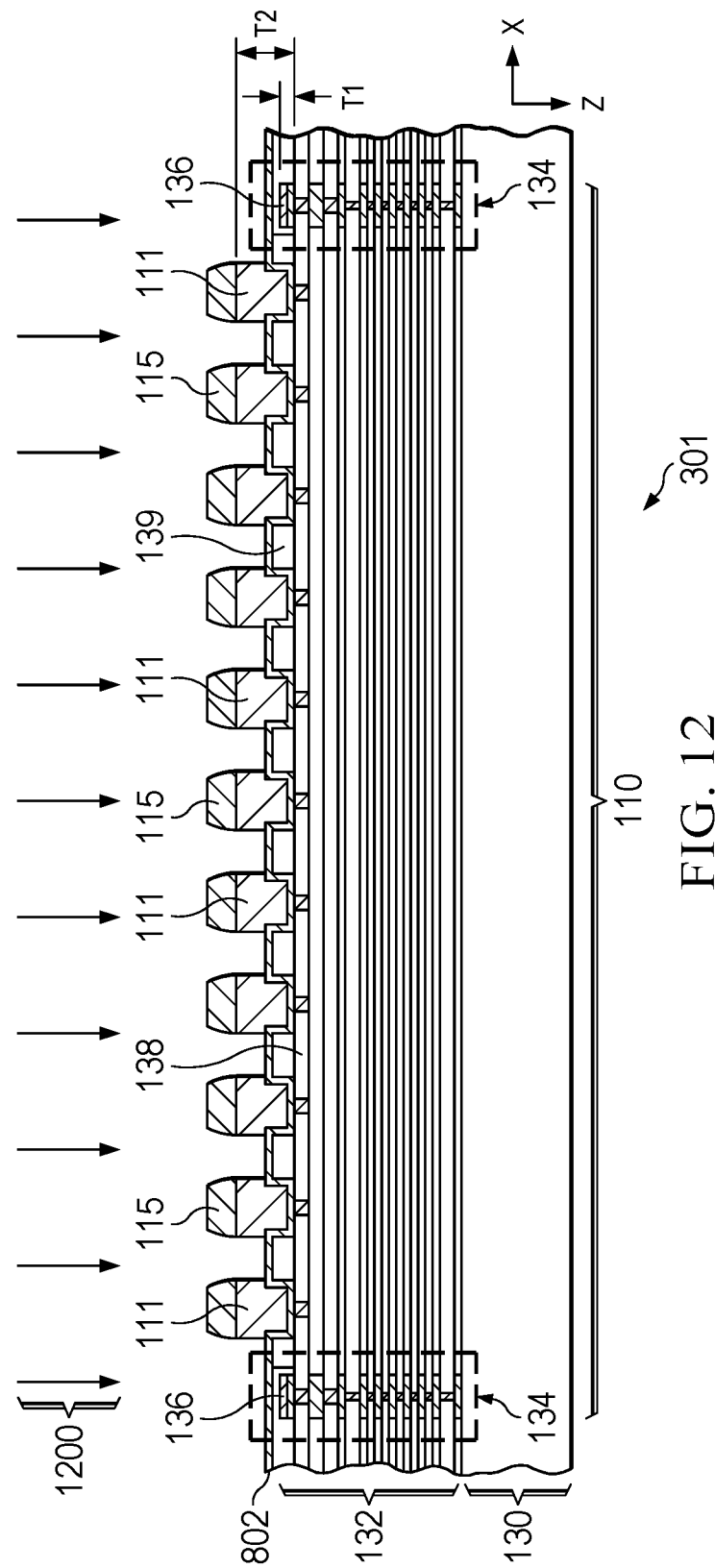

The method 200 continues at 222 in FIG. 2 with removal of the second plating mask. FIG. 12 shows one example, in which a process 1200 is performed that removes the second plating mask 902 and leaves the protruded metal feature 136, the conductive terminals 111, the respective solder portions 115, and the remaining exposed portions of the second copper seed layer 802.

Figure 13:
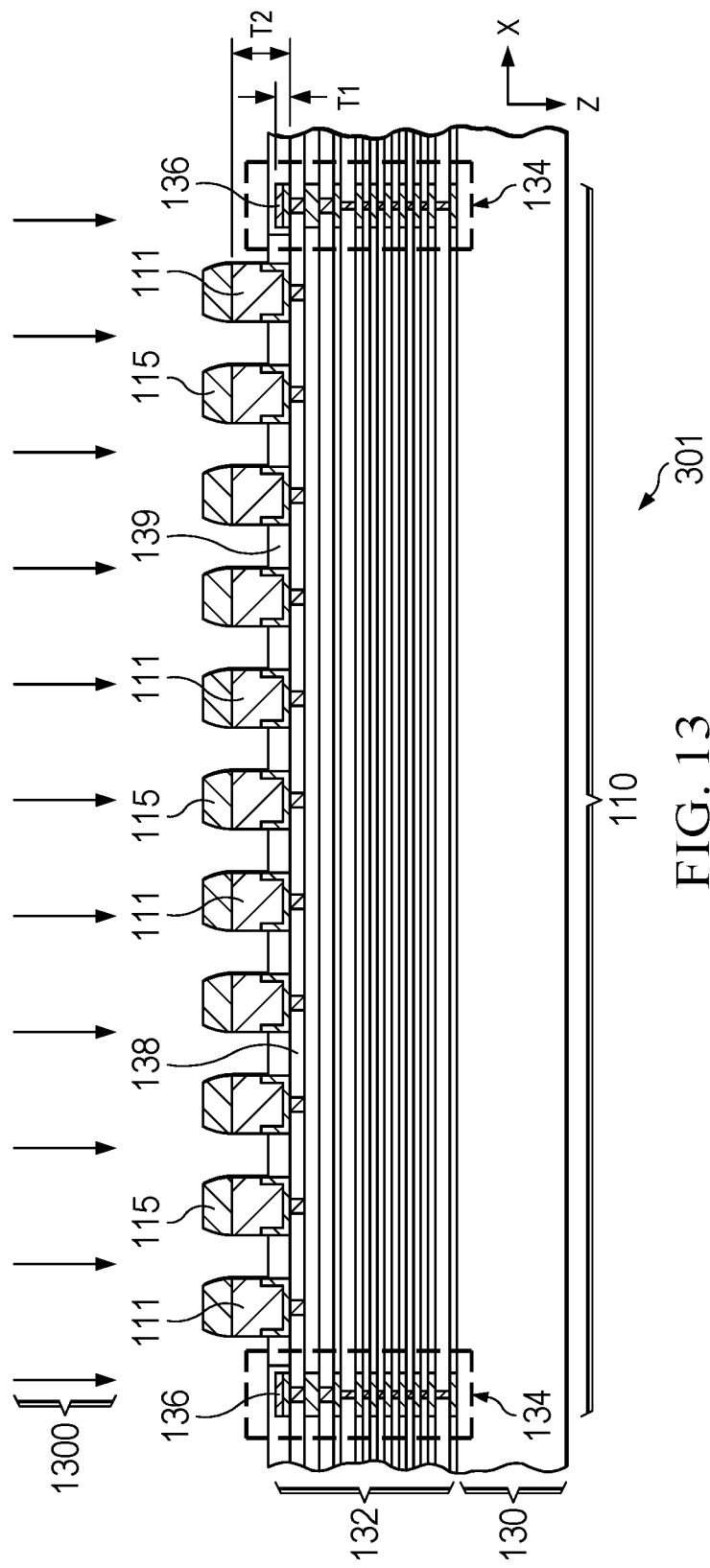

At 224, the remaining exposed portions of the second copper seed layer 802 are removed. FIG. 13 shows one example, in which an etching or other process 1300 is performed that removes the copper seed layer 802 between the respective conductive terminals 111 and the protruded metal feature 136 (and any included second protruded metal feature 137, e.g., FIG. 1A above). The process 1300 may remove a small amount of the plated features 111, 136 (and any included feature 137), and the initial electroplating thicknesses (during the first and second electroplating processes at 214 and 220 in FIG. 2) can be increased by a suitable amount such that the protruded metal feature 136 has the desired first thickness T1 and the conductive terminals 111 have the desired second thickness T2 after the process 1300 is finished.

Figure 14:
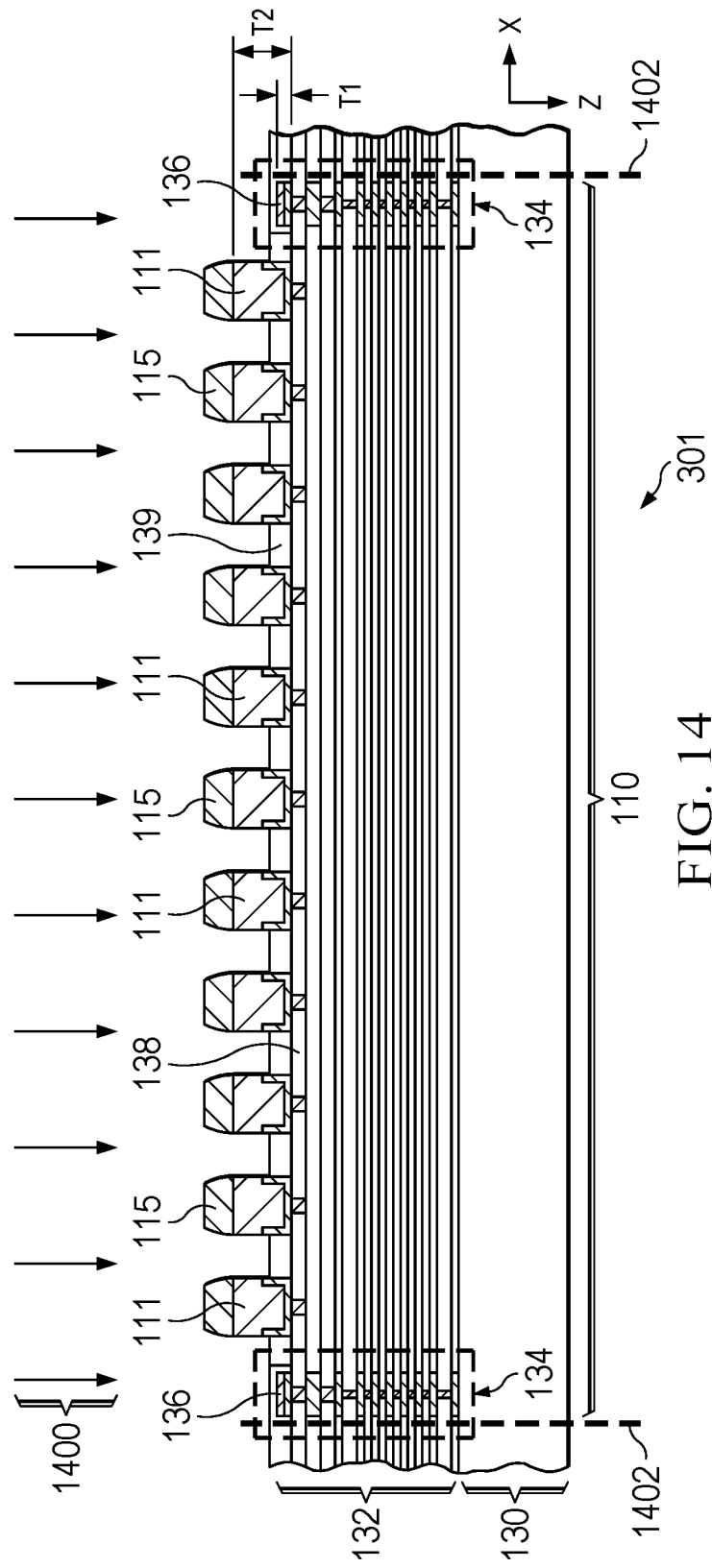

At 228 in FIG. 2, the method 200 continues with die singulation or separation processing. FIG. 14 shows one example, in which a cutting process 1400 is performed that cuts along scribe streets or scribe areas between adjacent unit areas of the processed wafer in order to separate individual semiconductor dies 110 from the wafer structure. Any suitable separation or cutting process 1400 can be used at 228, such as saw cutting, laser cutting, etching, or combinations thereof, etc.

Figure 15:
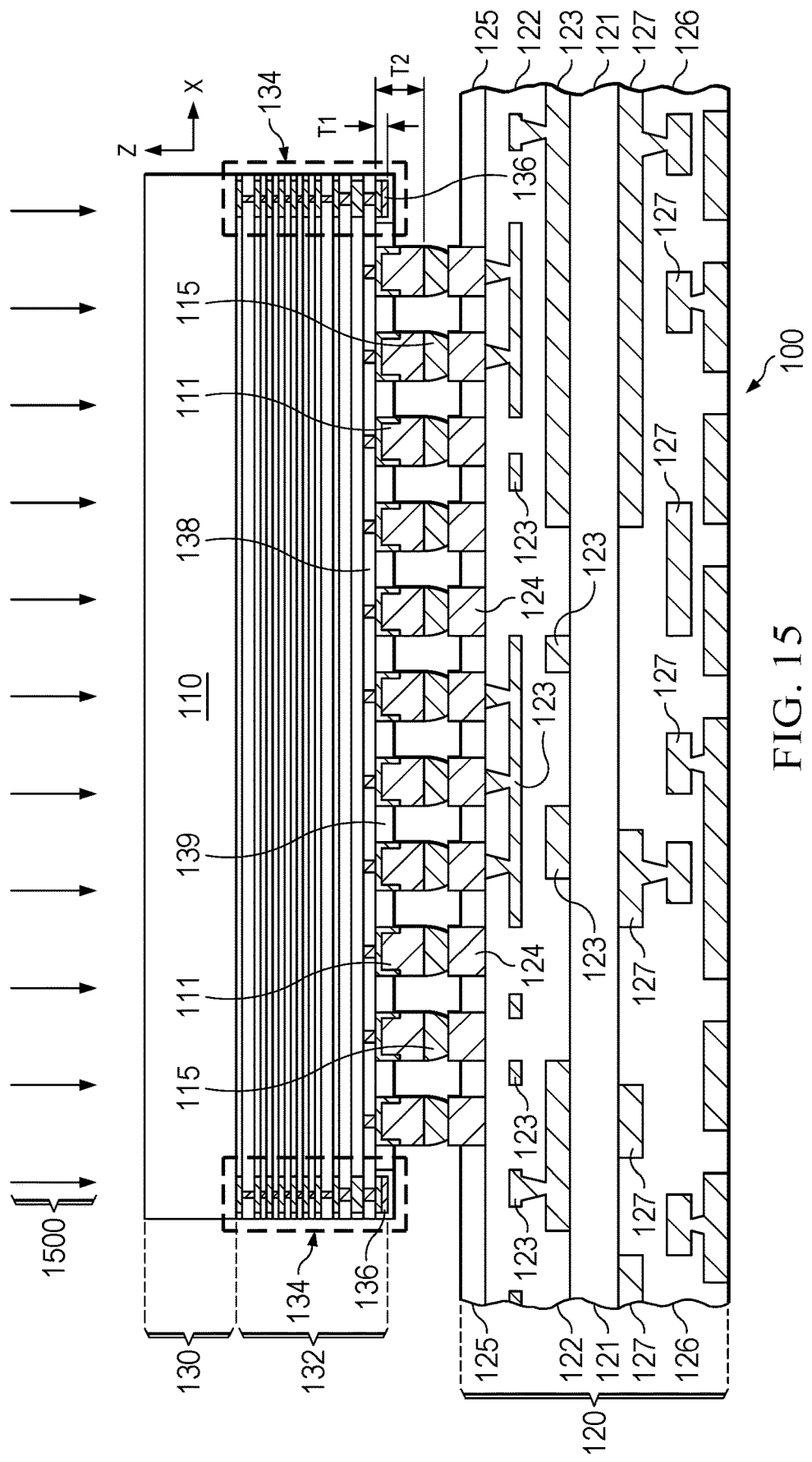

The method 200 continues with die attachment at 230 in FIG. 2. In one example, a lead frame panel array is provided having rows and columns of unit areas, and individual ones of the separated semiconductor dies 110 are attached to die attach pads or other suitable support structures of the lead frame panel array for subsequent electrical interconnection formation using bond wires (not shown). In the illustrated example, a multilevel package substrate structure is provided having rows and columns of individual unit areas for flip-chip die attach processing at 230. FIG. 15 shows one example, in which a flip-chip die attach process 1500 is performed using an array panel with unit areas corresponding to prospective multilevel package substrates 120 as described above in connection with FIGS. 1 and 1A. The die attach process 1500 in one example includes dipping or otherwise providing the solder portions 115 on the ends of the conductive terminals 111 of individual semiconductor dies 110, and subsequent engagement of the solder portions 115 with respective ones of the conductive features 124 of the package substrate 120 in each unit area of the panel array, for example, using automated pick and place equipment (not shown). The die attach process 1500 in one example further includes thermal processing to reflow the solder portions 115 and create solder joints between the individual conductive terminals 111 of the semiconductor die 110 and respective ones of the conductive features 124.

Figure 16:
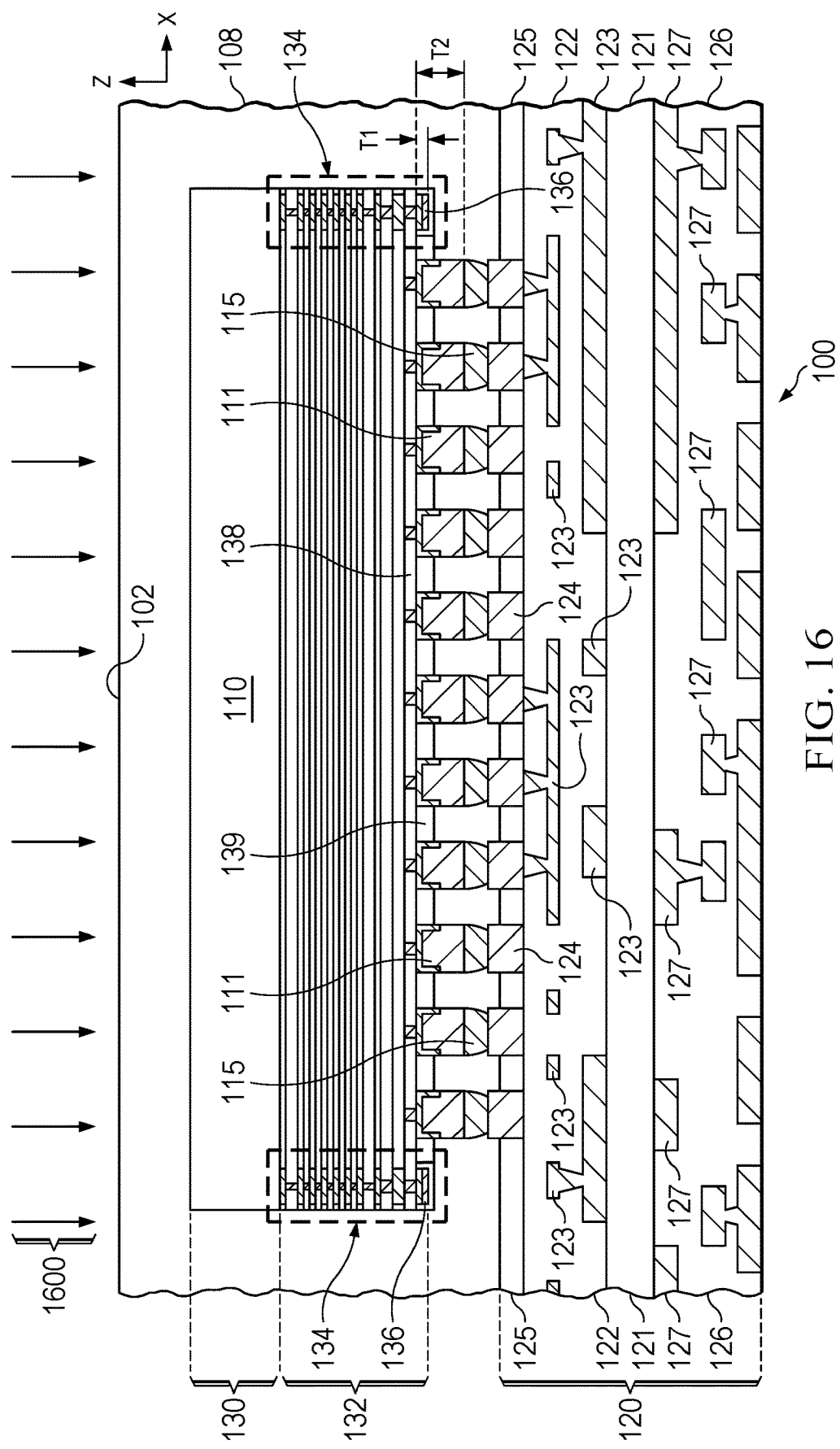

The method 200 continues at 232 in FIG. 2 with package structure formation. In one example, the processing at 232 includes molding operations to form the molded package structure 108 in individual unit areas or groups thereof in the panel array structure. FIG. 16 shows one example, in which a molding process 1600 is performed that forms the package structure 108. In one implementation, the molding at 232 can be performed using any suitable molding equipment. In one implementation, a single mold cavity can be used for an entire panel array or multiple cavities can be used for individual unit areas thereof or groups of unit areas, such as column-wise mold cavities, or combinations thereof. The package structure 108 in one example at least partially encloses the semiconductor die 110 and upper portions of the substrate 120 in each unit area of the panel array. In certain examples, the molding processing at 232 in FIG. 2 can include separate formation of multiple molded portions of a package structure, such as initial mold underfill formation, followed by a subsequent top molding process, or the molding at 232 creates a mold underfill followed by attachment of a metal lid (not shown) over at least a portion of a top side of the semiconductor die 110 without forming a second top mold structure.

Figure 17:
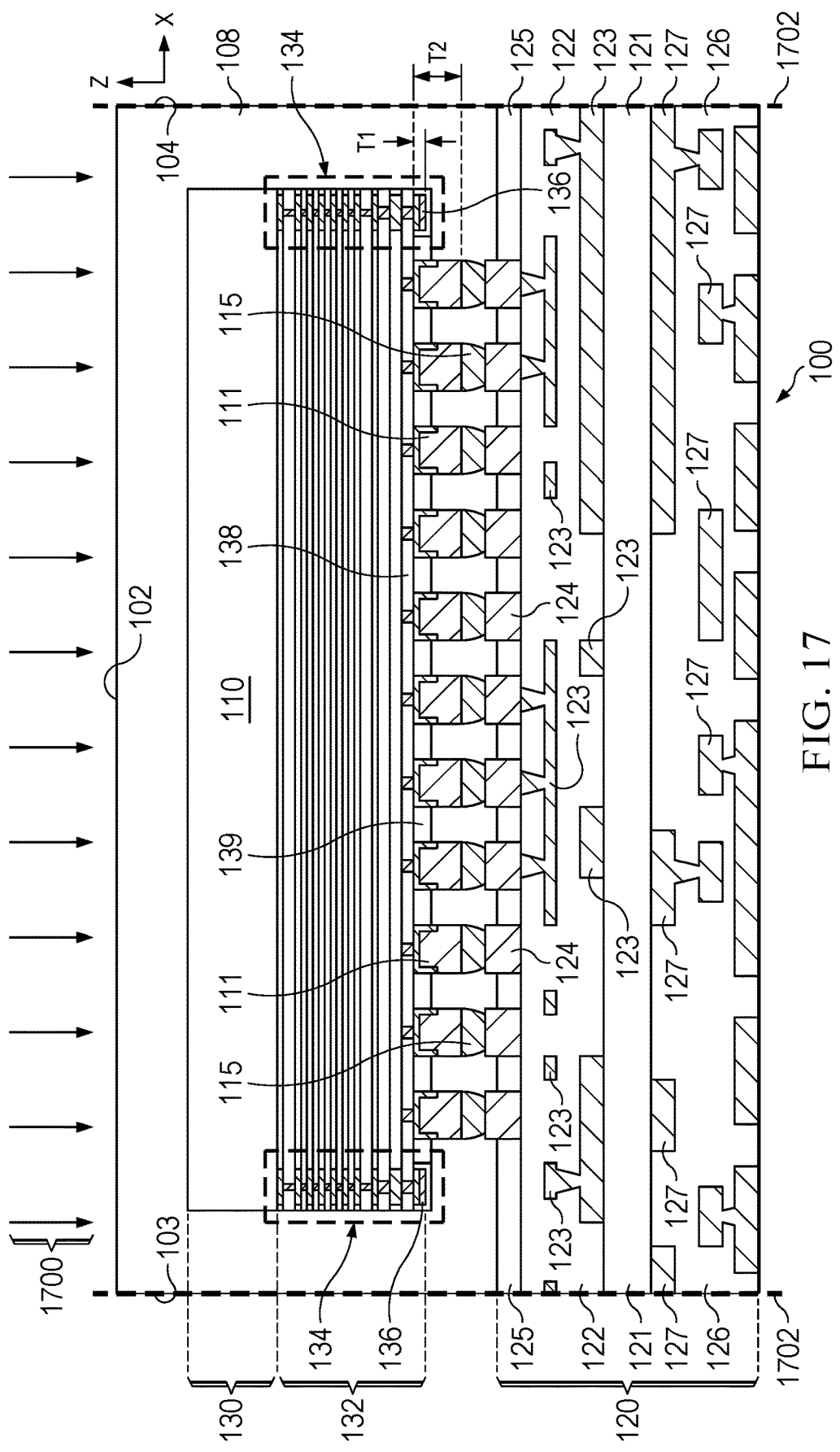

The method 200 in one example also includes package separation at 234 in FIG. 2 to separate individual packaged electronic devices 100 from the processed panel array structure, for example, to form strip or panel array based flip-chip chip scale package (FCCSP) devices (not shown). FIG. 17 shows one example, in which a saw cutting separation process 1700 is performed that separates individual packaged electronic devices 100 from the processed panel array structure by cutting along lines 1702. Any suitable cutting or separation process can be used, including without limitation saw cutting, laser cutting, chemical etching, etc. or combinations thereof. In certain examples, the method 200 can also include final device testing after package separation at 234 and/or wafer level testing (e.g., before die separation at 228 in FIG. 2). In certain implementations, the package separation processing at 234 can be omitted, for example, to form certain flip-chip ball grid array (FCBGA) devices.

Figure 18:
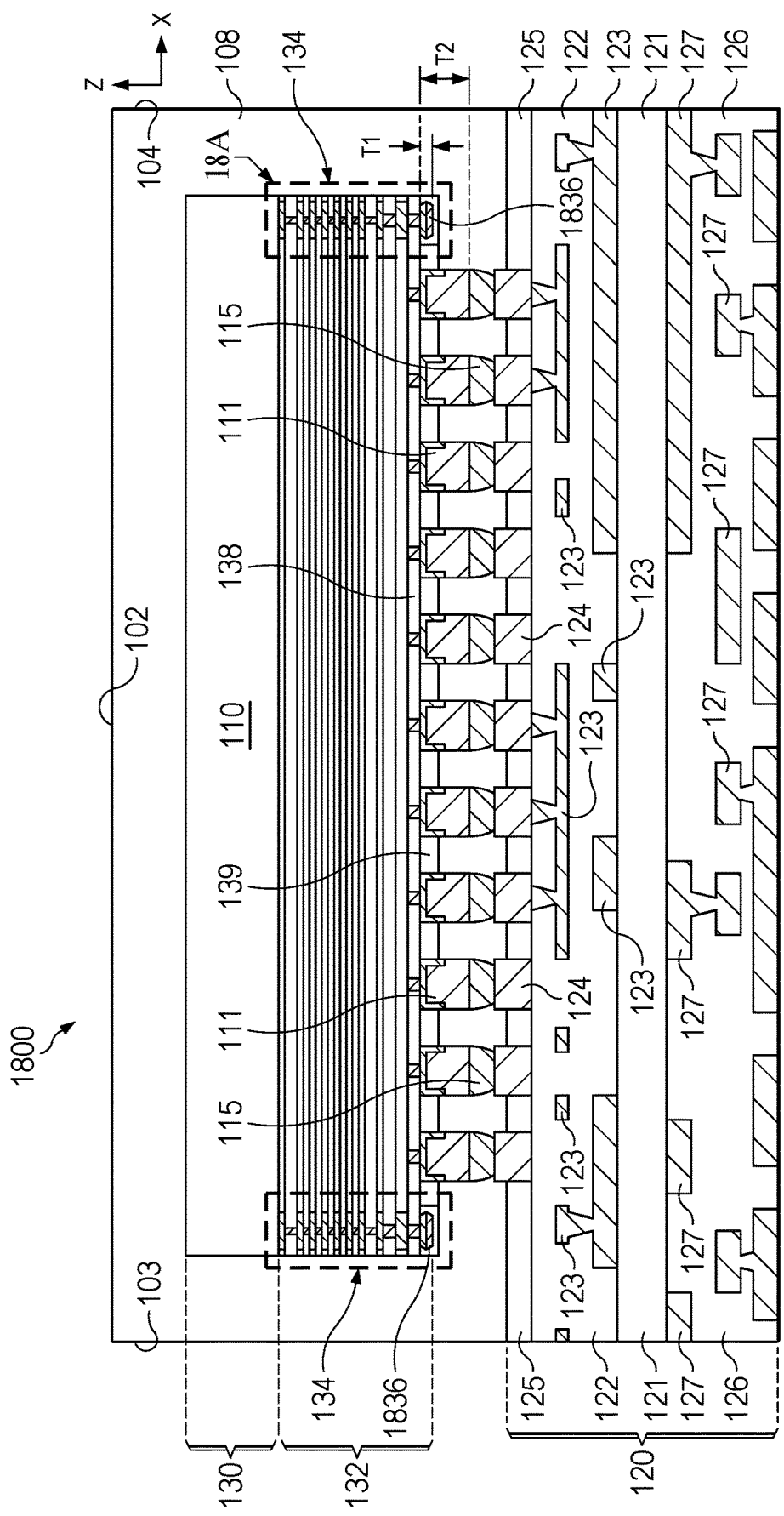
FIG. 18 is a sectional side elevation view of another packaged electronic device having a protruded metal feature with an angled side over a crack arrest structure to mitigate delamination and crack propagation.
Figure 18A:
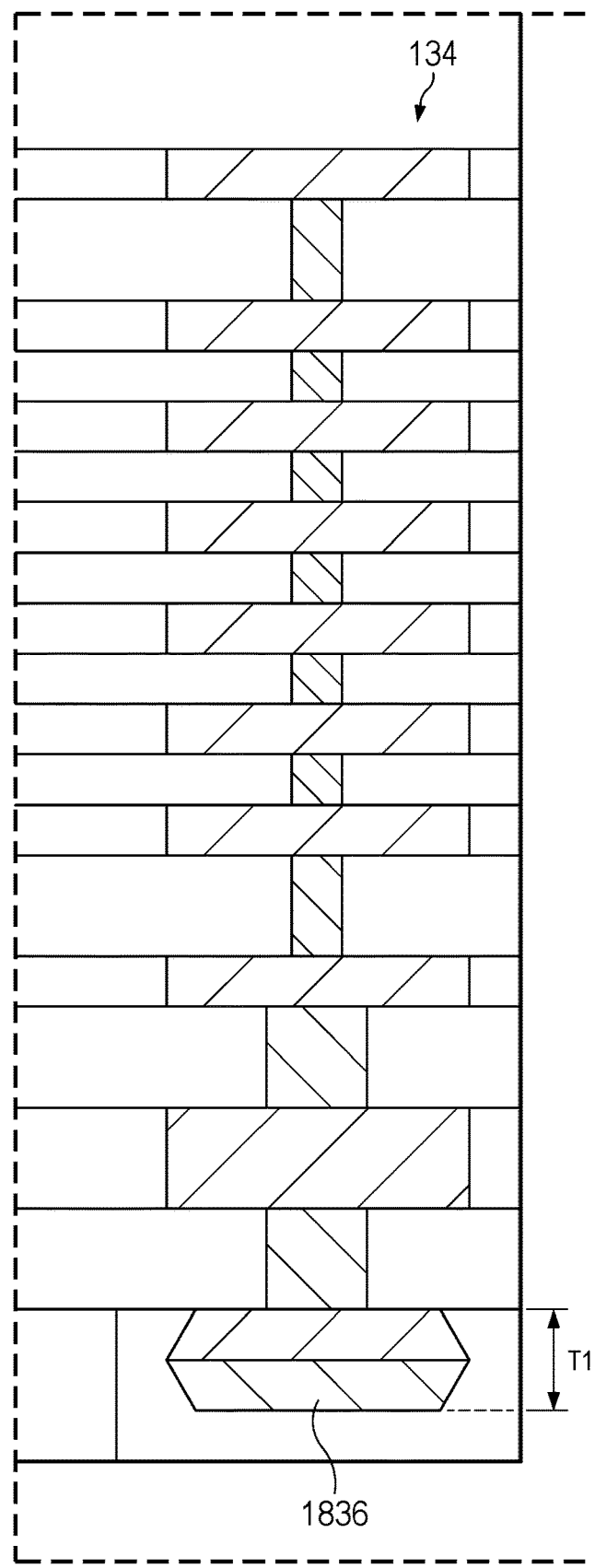
FIG. 18A is a partial sectional side view showing further details of the protruded metal feature of FIG. 18.

FIGS. 18-23 show further example electronic devices with a protruded metal feature to mitigate crack propagation, wherein unless otherwise indicated below, similarly numbered structures, features, sizes, etc. correspond to the corresponding numbered structures, features, sizes etc. as described above. FIG. 18 shows a packaged electronic device 1800 having a protruded metal feature 1836 with angled non-planar sides over the crack arrest structure 134 to mitigate delamination and crack propagation, and FIG. 18A shows a partial sectional side view to illustrate further details of the protruded metal feature 1836 in FIG. 18. In the illustrated example, the lateral sides along the first direction X are tapered outward from the respective bottom and top sides thereof approximately midway along the thickness T1. In this example, the polyimide layer 139 covers the non-the planar sides in the top side of the protruded metal feature 1836, and the protruded metal feature 1836 is or includes aluminum, all or at least a portion of which extend over the crack arrest structure 134. In other examples, the protruded metal feature 1836 can be or include solder or other suitable metal. The protruded metal feature 1836 can be formed by any suitable processing techniques, including without limitation deposition such as CVD, electroplating, printing, dispensing, etc., alone or in combination with masking and etching or other suitable technique to form the non-planar side or sides thereof.

Figure 19:
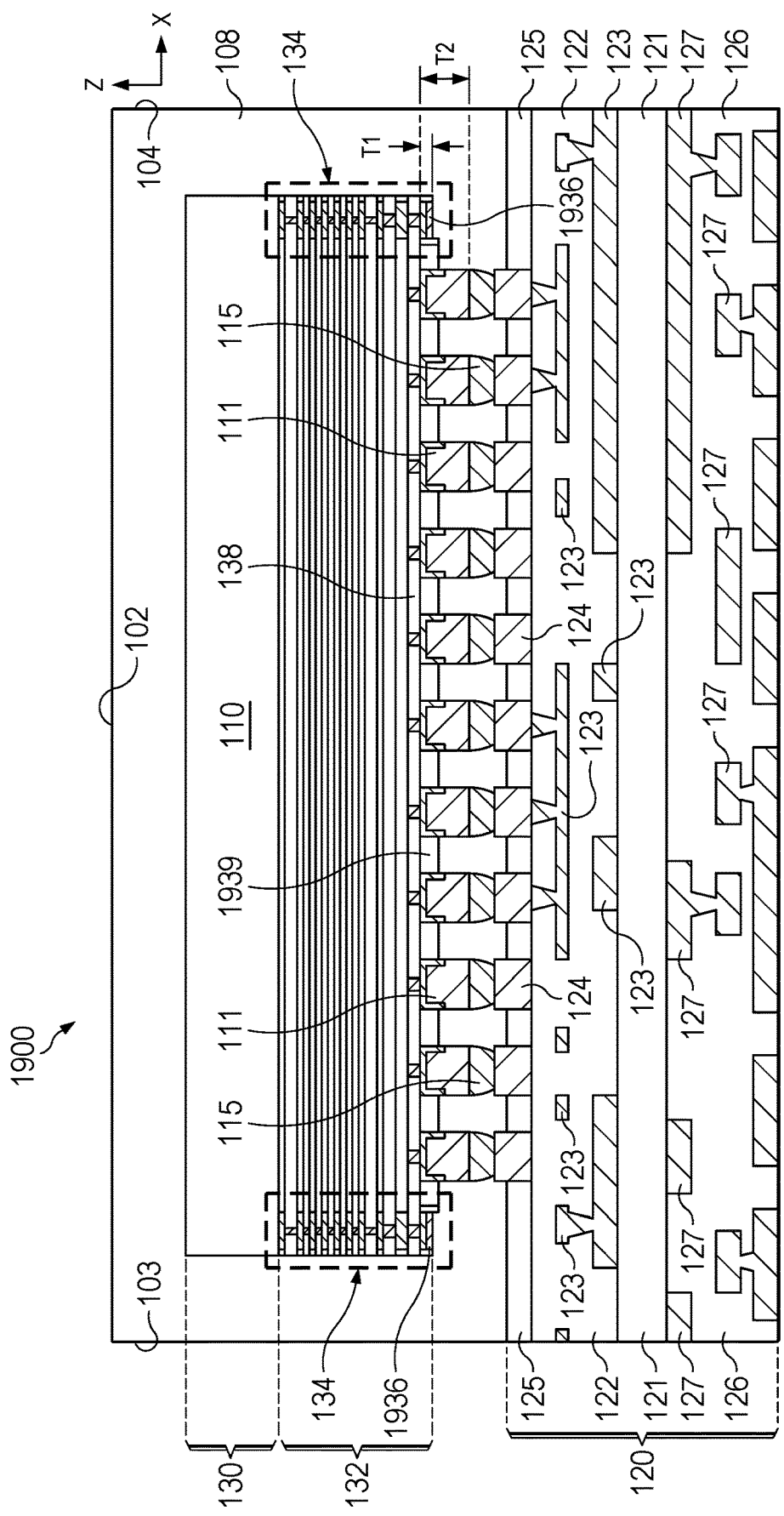
FIG. 19 is a sectional side elevation view of another packaged electronic device having a protruded metal feature that partially abuts a molded package structure.

FIG. 19 shows another example packaged electronic device 1900 with a protruded metal feature 1936 with approximately planar sides over the crack arrest structure 134 to mitigate delamination and crack propagation. In this example, the innermost lateral side of the protruded metal feature 1936 abuts a portion of the polyimide layer 1939, but the polyimide layer 1939 does not cover the outermost lateral side or the top side of the protruded metal feature 1936, which sides and portions thereof at least partially abut the molded package structure 108. In certain examples, the protruded metal feature 1936 is or includes aluminum, all or at least a portion of which extend over the crack arrest structure 134. In other examples, the protruded metal feature 1936 can be or include solder or other suitable metal. The protruded metal feature 1936 can be formed by any suitable technique, such as those described above.

Figure 20:
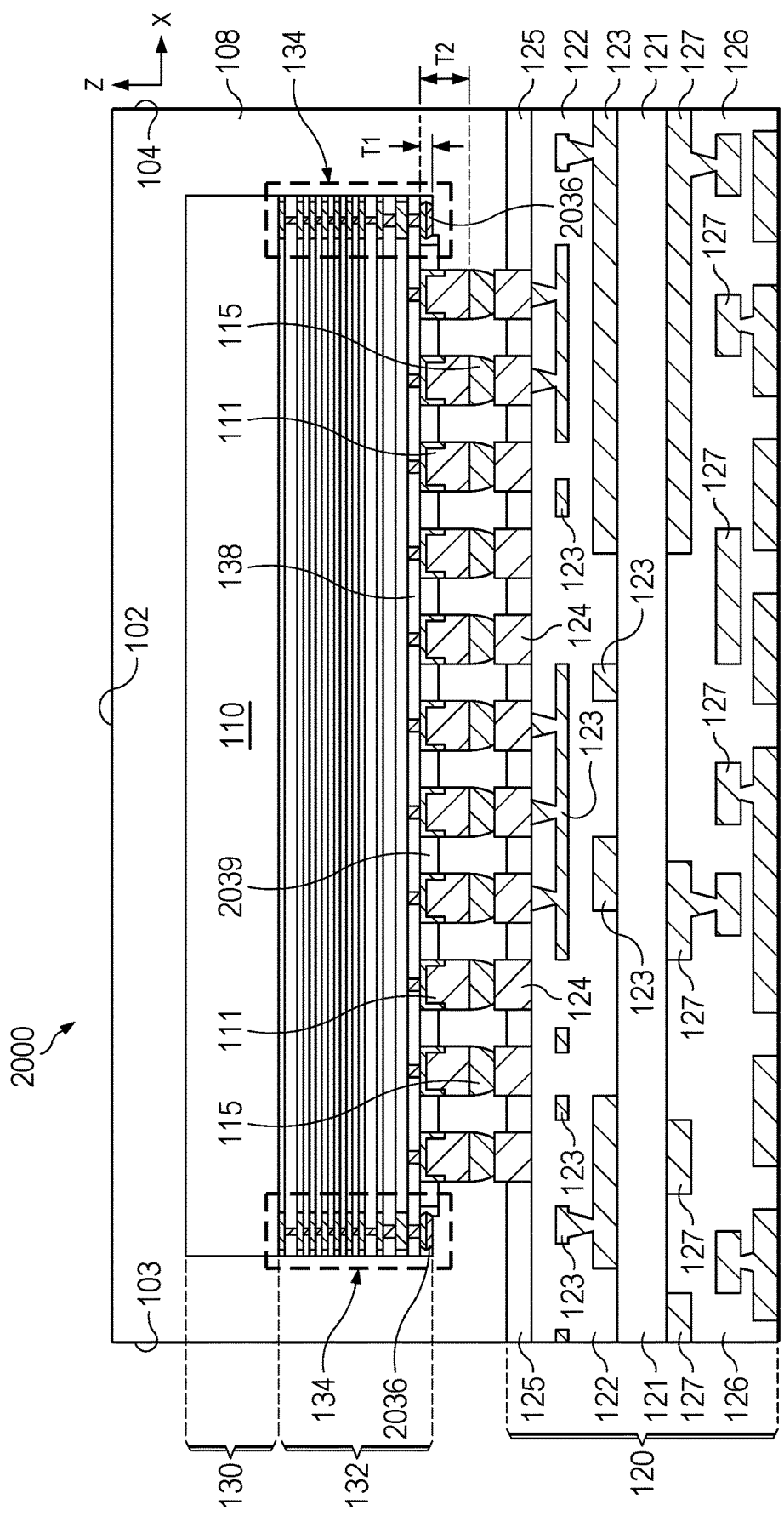
FIG. 20 is a sectional side elevation view of another packaged electronic device having a protruded metal feature with an angled side that partially abuts a molded package structure.

FIG. 20 shows another packaged electronic device 2000 having a protruded metal feature 2036 with one or more angled sides with non-planar profiles, and outermost one of which partially abuts the molded package structure 108. In this example, with the top side of the protruded metal feature 2036 also abuts the molded package structure 108, and the non-planar innermost lateral side of the protruded metal feature 2036 abuts a polyimide layer 2039. The protruded metal feature 2036 in this example can be formed by any suitable technique, such as those described above.

Figure 21:
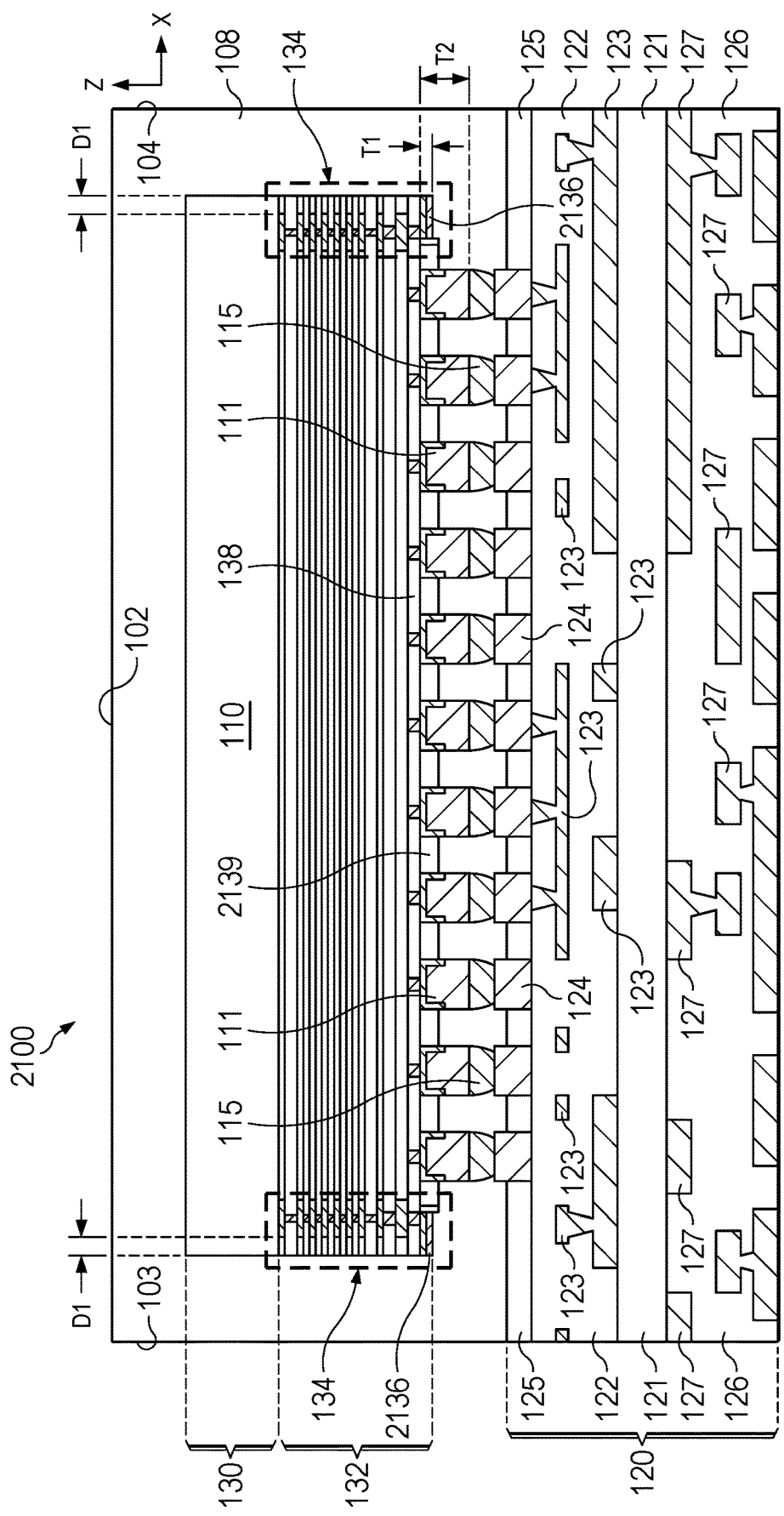
FIG. 21 is a sectional side elevation view of another packaged electronic device having a protruded metal feature that extends laterally past a crack arrest structure to mitigate delamination and crack propagation.

FIG. 21 shows another packaged electronic device 2100 with a protruded metal feature 2136 that extends laterally past the crack arrest structure 134 to mitigate delamination and crack propagation. As with the above examples, different conductive metal materials can be used to form the protruded metal feature 2136, including without limitation solder, copper or other metal, etc., which can be formed by any suitable technique, such as those described above. In this example, an inner lateral sidewall of the protruded metal feature 2136 abuts a polyimide layer 2139, and the outermost lateral sidewall and top side of the protruded metal feature 2136 abuts the molded package structure 108.

Figure 22:
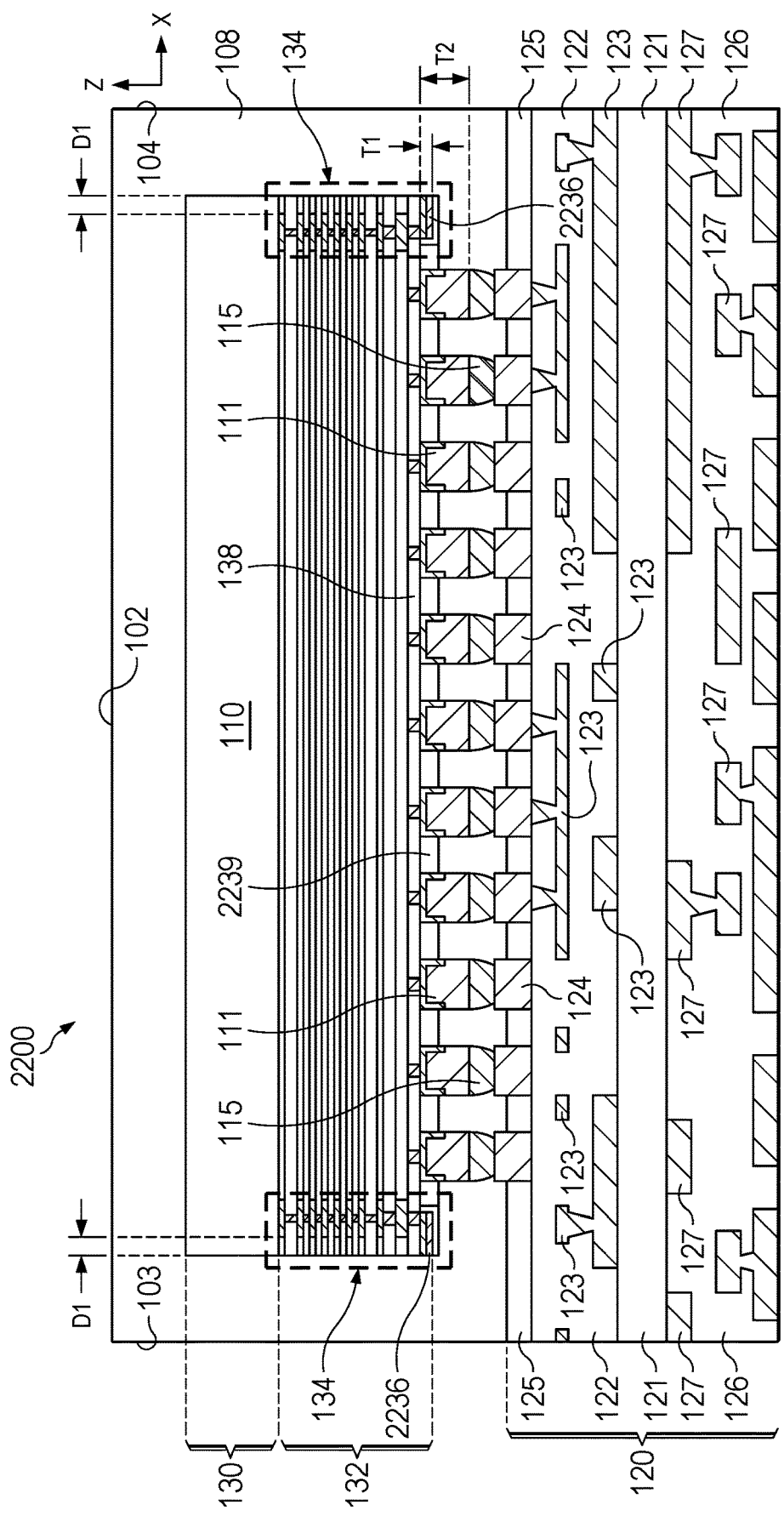
FIG. 22 is a sectional side elevation view of another packaged electronic device having a protruded metal feature that extends laterally past a crack arrest structure and a polyimide layer extends over a top of the protruded metal feature to mitigate delamination and crack propagation.

FIG. 22 shows another example packaged electronic device 2200 that includes a protruded metal feature 2236 with generally planar lateral sides, and outermost one of which extends laterally past the crack arrest structure 134. In this example, a polyimide layer 2239 extends over and abuts a top side and the innermost lateral side of the protruded metal feature 2236 to mitigate delamination and crack propagation. In the example of FIG. 22, moreover, the polyimide layer 2239 does not cover the outermost lateral side of the protruded metal feature 2236, which instead abuts the molded package structure 108, for example, where the die separation processing (e.g., at 228 in FIG. 2) cuts through a lateral portion of the protruded metal feature 2236 during fabrication.

Figure 23:
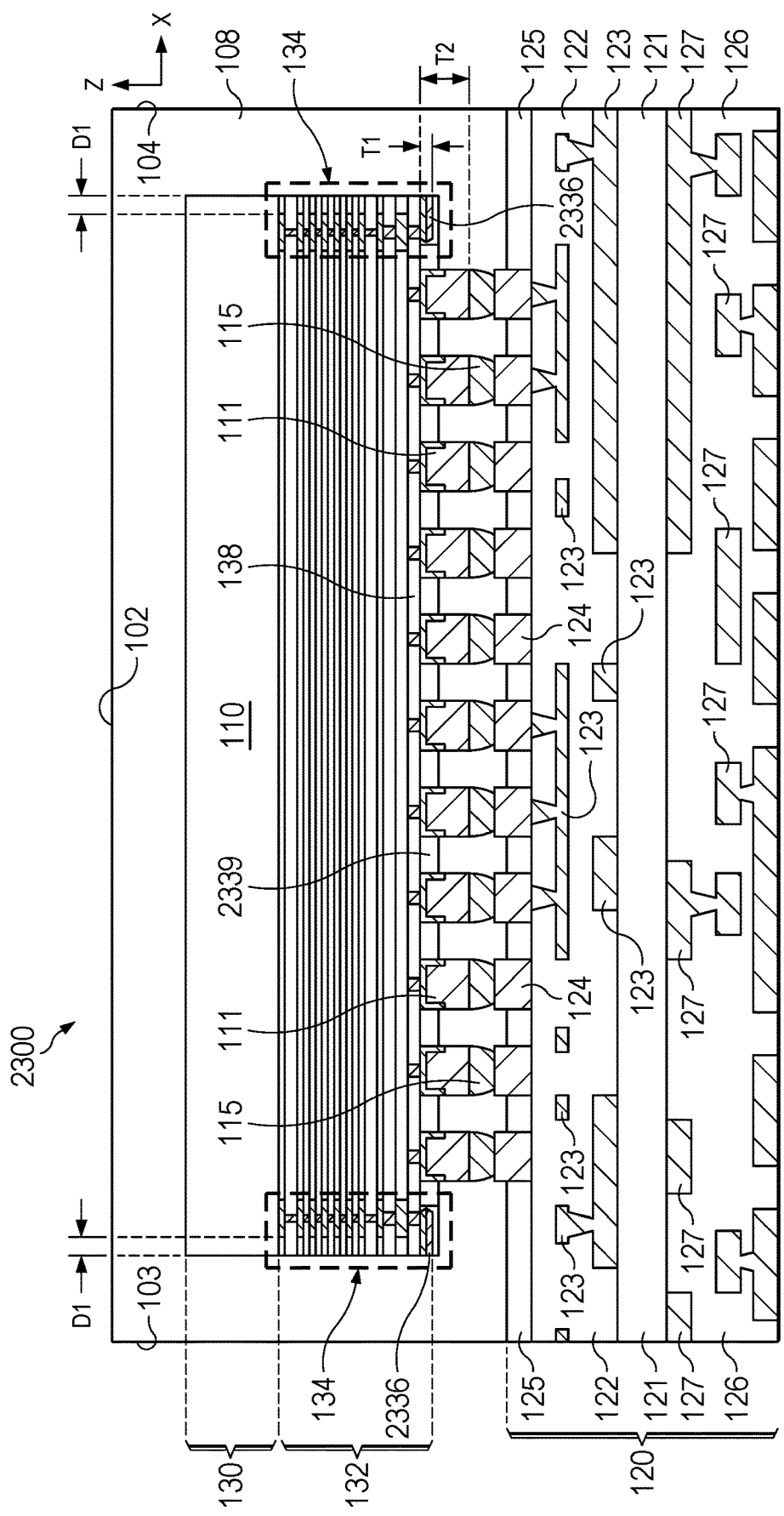
FIG. 23 is a sectional side elevation view of another packaged electronic device having a protruded metal feature that has an angled side and extends laterally past a crack arrest structure and a polyimide layer extends over a top of the protruded metal feature to mitigate delamination and crack propagation.

FIG. 23 shows a packaged electronic device 2300 with a protruded metal feature 2336 parentheses e.g., solder, metal, etc.) with a non-planar innermost angled side that abuts a polyimide layer 2339 and extends laterally past the crack arrest structure 134. In this example, the polyimide layer 2339 extends over and abuts the innermost lateral side and the top side of the protruded metal feature 2336 to mitigate delamination and crack propagation.

Figure 24:
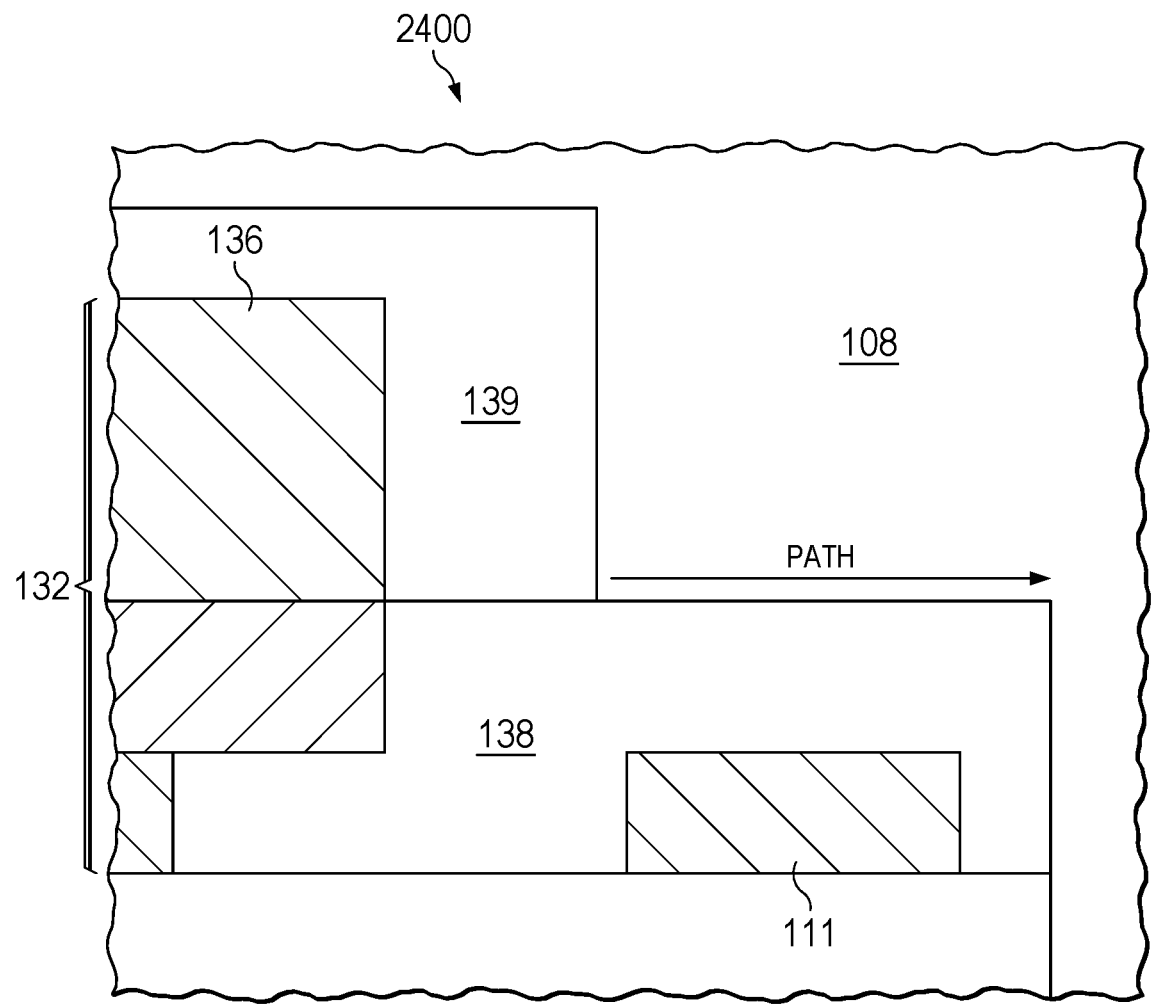
FIG. 24 is a partial side view of a modeled electronic device with a protruded metal feature over a crack arrest structure.
Figure 25:
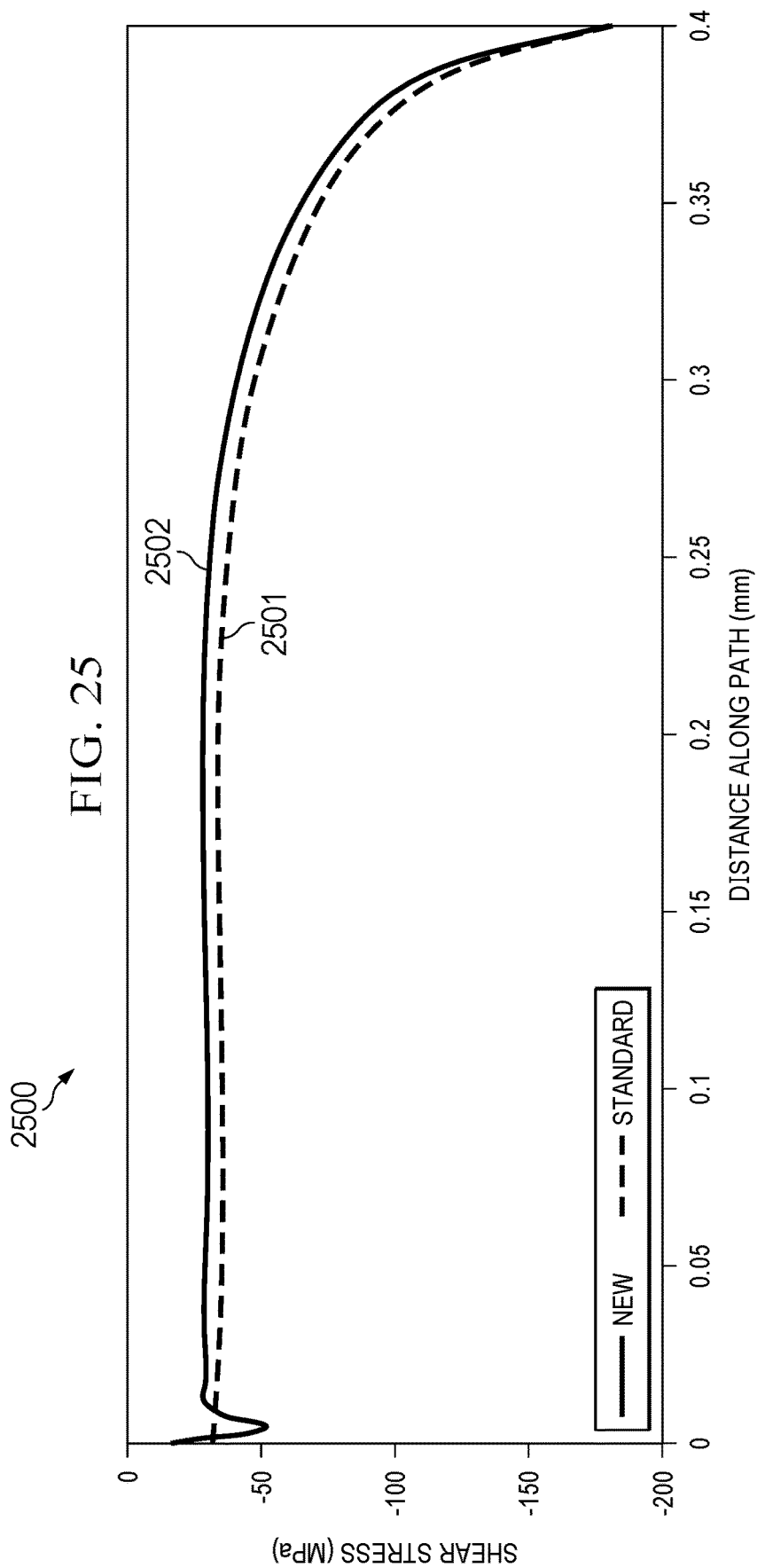
FIG. 25 is a graph of simulated shear stress in a first range of distance along a path in the model of FIG. 24.
Figure 26:
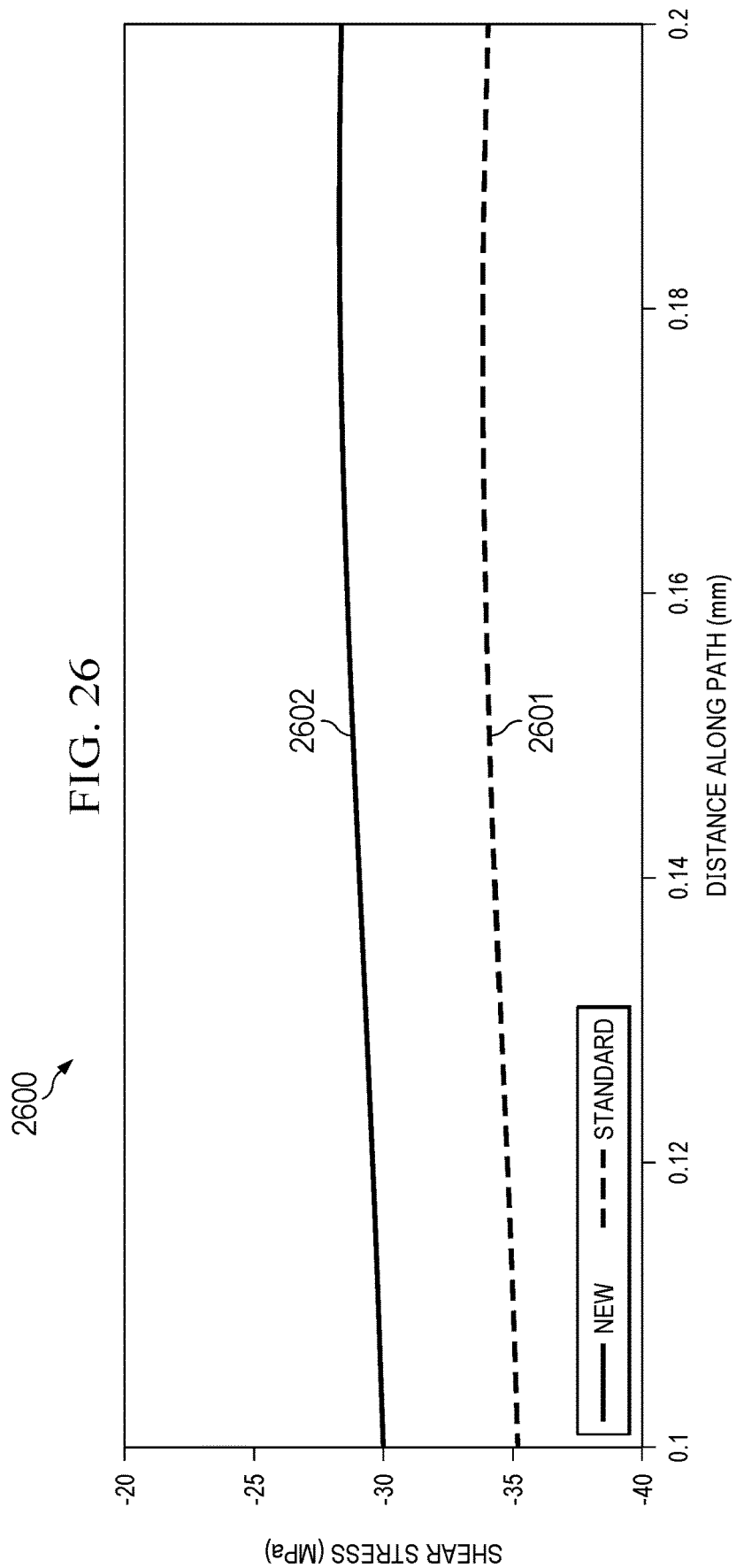
FIG. 26 is a graph of simulated shear stress in a smaller range of distance along the path in the model of FIG. 24.

Referring also to FIGS. 24-26, FIG. 24 shows a partial view of an electronic device model 2400 in two dimensions over temperature range of −65° C. to 150° C. with a protruded metal feature over a crack arrest structure and a laterally extended polyimide layer (e.g., electronic device 100 and protruded metal feature 136 over crack arrest structure 134 as described above), where the partially illustrated structural features are similarly numbered to the structures and features described above in connection with FIG. 1. The model 2400 in FIG. 24 indicates a path direction representing a modeled crack propagation path in the electronic device 100. FIG. 25 shows a graph 2500 of simulated shear stress as a function of distance along the path of the model 2400 in FIG. 24 in a first range of the distance, and FIG. 26 shows a graph 2600 of the simulated shear stress in a smaller second range of the distance along the path of the model 2400. The graph 2500 and FIG. 25 includes a curve 2501 showing a simulated shear stress in MPa on the path for an electronic device that does not include the protruded metal feature 136, and a second curve 2502 showing the shear stress of the modeled electronic device of FIG. 24. As seen in FIG. 25, the curves 2501 and 2502 demonstrate the decreased shear stress resulting from the inclusion of the protruded metal feature 136 over the crack arrest structure 134, with the model the example device having a lower shear stress than the device that does not include a protruded metal feature. The graph 2600 in FIG. 26 includes a curve 2601 showing the modeled shear stress for the device without a protruded metal feature and a second curve 2602 that shows the resulting lower modeled shear stress for the example modeled device 100 having the protruded metal feature 136 at least partially over the crack arrest structure 134 (e.g., over a smaller portion of the path distance than is shown in FIG. 25). The benefits shown in FIGS. 25 and 26 demonstrate the crack propagation mitigation advantages of the protruded metal feature 136 to provide a more robust packaged electronic device 100 that can operate across a wide temperature range. The described examples can help to mitigate delamination risks initiated from any epoxy-based mold compound to a polyimide interface and other interfaces within a packaged electronic device without requiring significantly different fabrication processing steps or tools, and without requiring material changes in the molded package structure 108, the passivation and protective overcoat layers and/or the semiconductor die materials. In certain implementations, the described structures including the protruded metal feature (e.g., 136 above) can change a crack propagation path from a linear/horizontal vector direction to a more tortuous vector by creating a protrusion feature in the scribe structure during fabrication processing, whether at the wafer level or thereafter, in which a protruded feature is fabricated above existing crack arrest features to physically extend onto the scribe providing a barrier to crack propagation. The protruded scribe feature impedes and creates a more tortuous crack propagation path.

Figure 27:
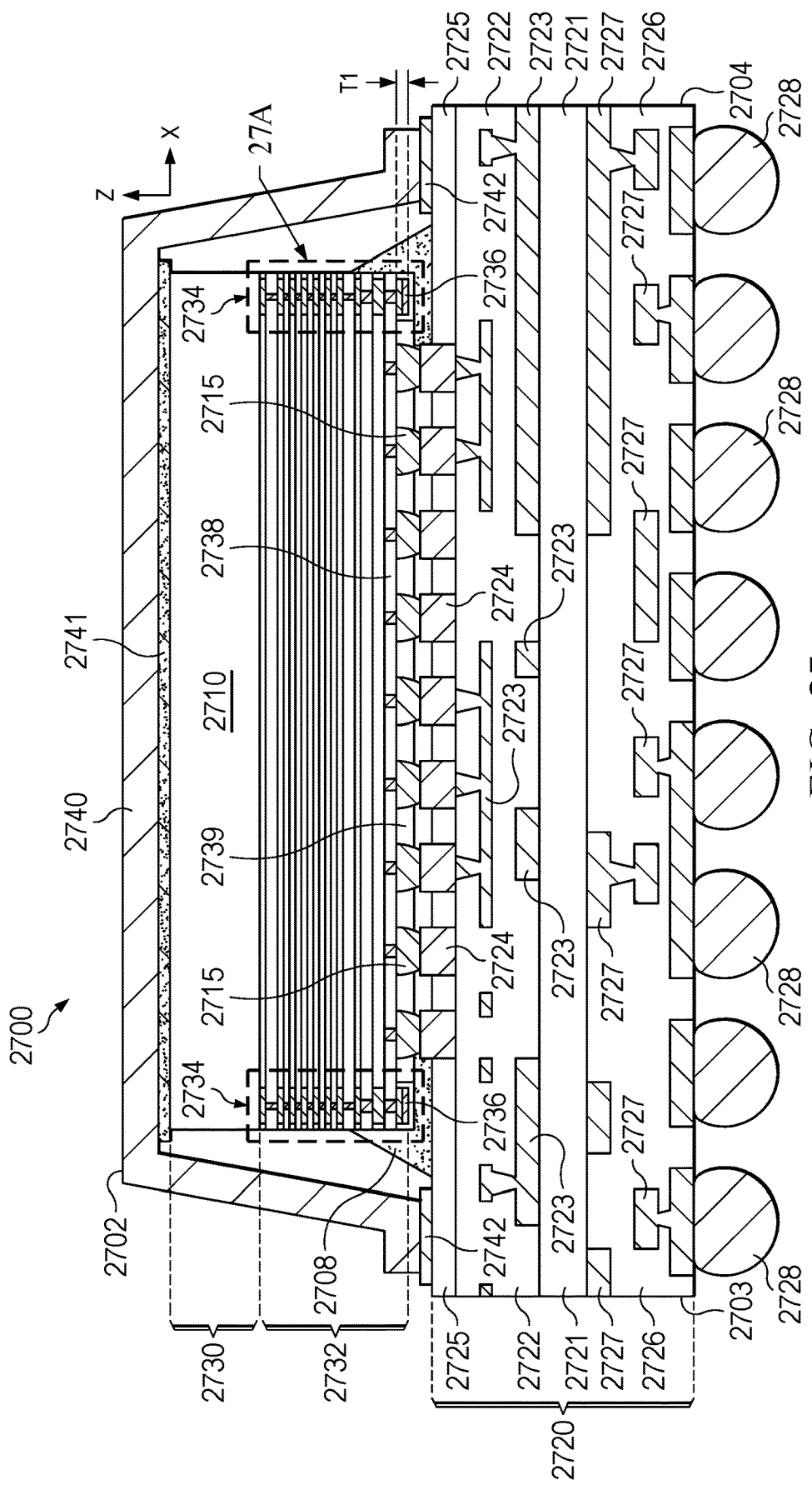
FIG. 27 is a sectional side elevation view of another packaged electronic device having a protruded metal feature over a crack arrest structure to mitigate delamination and crack propagation in a flip chip ball grid array (FCBGA) example.
Figure 27A:
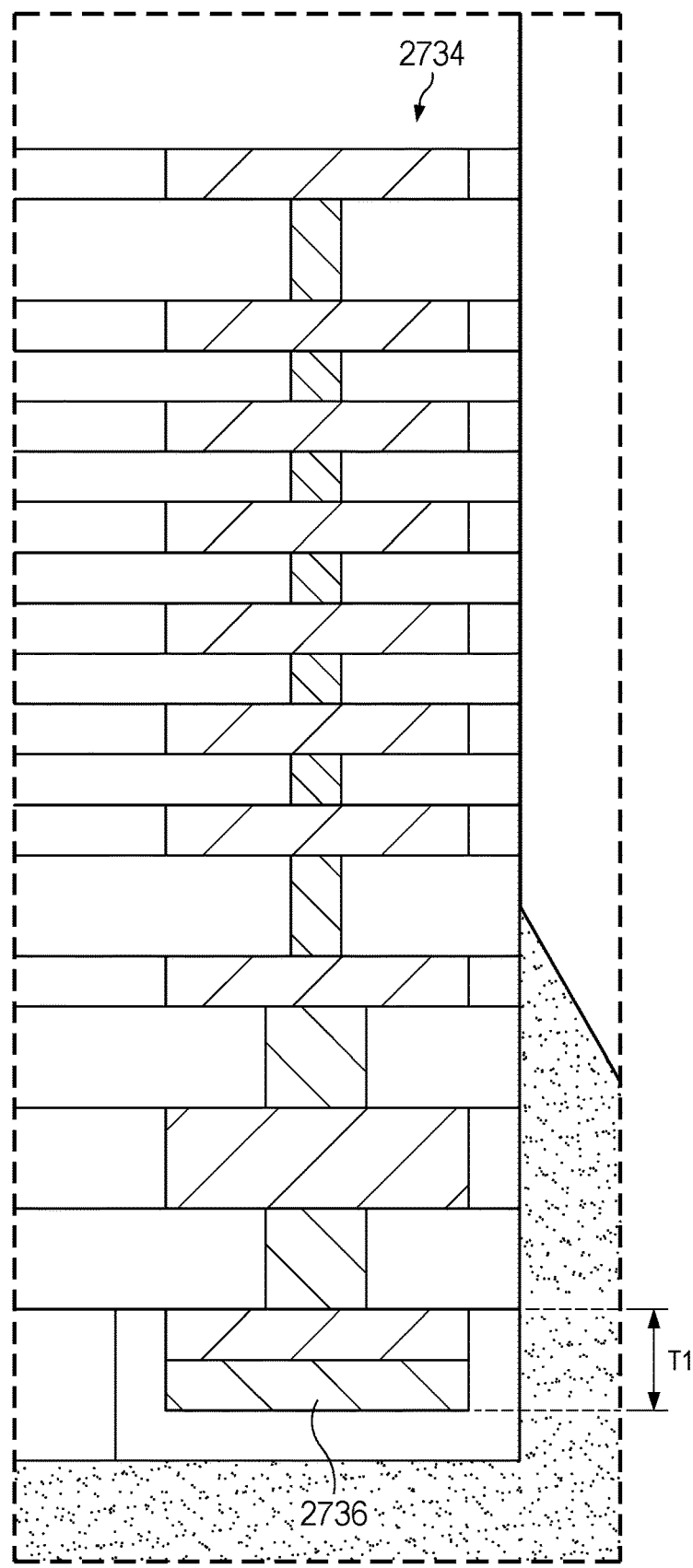
FIG. 27A is a partial sectional side view showing further details of the protruded metal feature of FIG. 27.

FIGS. 27 and 27A show another example packaged electronic device 2700 having a protruded metal feature 2736 over a crack arrest structure 2734 to mitigate delamination and crack propagation in a flip chip ball grid array (FCBGA) example, where FIG. 27A shows further details of the protruded metal feature 2736 in one example. The electronic device 2700 has solder balls 2728 in a ball grid array for connection to a host printed circuit board (not shown) and an epoxy-based molded or dispensed underfill adhesive 2708 that does not cover the upper portions of a semiconductor die 2710. The example FCBGA electronic device 2700 has a conductive metal lid 2740 (e.g., copper) attached to a top side of the semiconductor die 2710 by a thermal interface material (TIM) 2741 and attached to peripheral portions of the top side of a multilevel package substrate 120 by a with a lid seal adhesive 2742. Apart from these and other differences apparent from the drawings, various other structures, dimensions, and/or features T1, 2702-2704, 2715, 2720-2727, 2730, 2732, 2734, 2736, 2738, and 2739 correspond to the respective structures, dimensions, and/or features T1, 102-104, 115, 120-127, 130, 132, 134, 136, 138, and 139 described above in connection with the electronic device 100 of FIGS. 1 and 1A.

Modifications are possible in the described examples, and other implementations are possible, within the scope of the claims.

What is claimed is:

1. An electronic device, comprising:
a semiconductor die having a semiconductor body, a metallization structure over the semiconductor body, a protective overcoat layer over the metallization structure, a polyimide layer over the protective overcoat layer, a crack arrest structure including contiguous metal crack arrest features in the metallization structure that extend from the protective overcoat layer toward the semiconductor body, conductive terminals that extend from the metallization structure through the protective overcoat layer and the polyimide layer, and a protruded metal feature over the crack arrest structure and at least partially abutting the polyimide layer; and
a package structure that at least partially encloses the semiconductor die.

2. The electronic device of claim 1, wherein the package structure at least partially abuts the protruded metal feature.

3. The electronic device of claim 2, wherein the protruded metal feature has a thickness that is approximately equal to a thickness of the polyimide layer.

4. The electronic device of claim 2, wherein the protruded metal feature has a non-planar side that faces a lateral side of the electronic device.

5. The electronic device of claim 1, wherein a first side of the protruded metal feature abuts the crack arrest structure, and the polyimide layer encloses the remaining sides of the protruded metal feature.

6. The electronic device of claim 5, wherein the protruded metal feature is spaced apart from a lateral side of the semiconductor die.

7. The electronic device of claim 5, wherein the protruded metal feature has a non-planar side that faces a lateral side of the electronic device.

8. The electronic device of claim 1, wherein:
the semiconductor die has a first pair of opposite lateral sides spaced apart from one another along a first direction, a second pair of opposite lateral sides spaced apart from one another along a second direction that is orthogonal to the first direction, and opposite top and bottom sides spaced apart from one another along a third direction that is orthogonal to the first and second directions;
the crack arrest structure is proximate one of the lateral sides of the semiconductor die.

9. The electronic device of claim 8, wherein the package structure at least partially abuts the protruded metal feature.

10. The electronic device of claim 8, wherein a first side of the protruded metal feature abuts the crack arrest structure, and the polyimide layer encloses the remaining sides of the protruded metal feature.

11. The electronic device of claim 8, wherein:
the protruded metal feature is a first protruded metal feature;
the electronic device further comprises a second protruded metal feature spaced apart from the first protruded metal feature along one of the first and second directions; and
the second protruded metal feature is between the first protruded metal feature and a lateral side of the electronic device.

12. The electronic device of claim 1, wherein the protruded metal feature has a thickness that is approximately equal to a thickness of the polyimide layer.

13. The electronic device of claim 1, wherein the protruded metal feature has a non-planar side that faces a lateral side of the electronic device.

14. The electronic device of claim 1, wherein the protruded metal feature is spaced apart from a lateral side of the semiconductor die.

15. The electronic device of claim 1, wherein the conductive terminals are soldered to conductive features of a package substrate.

16. A system, comprising:
a circuit board; and
an electronic device having a semiconductor die and a package structure, wherein:
the semiconductor die has a semiconductor body, a metallization structure over the semiconductor body, a protective overcoat layer over the metallization structure, a polyimide layer over the protective overcoat layer, a crack arrest structure including contiguous metal crack arrest features in the metallization structure that extend from the protective overcoat layer toward the semiconductor body, conductive terminals that extend from the metallization structure through the protective overcoat layer and the polyimide layer and are electrically coupled to conductive features of the circuit board, and a protruded metal feature over the crack arrest structure and at least partially abutting the polyimide layer; and
the package structure at least partially encloses the semiconductor die.

17. A method of fabricating an electronic device, the method comprising:
forming a protective overcoat layer over a crack arrest structure with contiguous metal crack arrest features in a metallization structure over a semiconductor body of a wafer;
forming a protruded metal feature over the crack arrest structure;
forming conductive terminals that extend from the metallization structure through the protective overcoat layer; and
forming a polyimide layer over the protective overcoat layer and at least partially abutting the protruded metal feature.

18. The method of claim 17, wherein:
forming the protruded metal feature includes:
forming a first plating mask that exposes an area over the crack arrest structure; and
performing a first electroplating process that forms the protruded metal feature over the crack arrest structure; and
forming the conductive terminals includes:
forming a second plating mask that covers the protruded metal feature and exposes prospective areas corresponding to the conductive terminals; and
performing a second electroplating process that forms the conductive terminals.

19. The method of claim 17, wherein the polyimide layer does not enclose the protruded metal feature.

20. The method of claim 17, wherein the polyimide layer encloses the protruded metal feature.

* * * * *